United States Patent
Whetsel, Jr.

[11] Patent Number: 6,081,916
[45] Date of Patent: Jun. 27, 2000

[54] IC WITH TEST CELLS HAVING SEPARATE DATA AND TEST PATHS

[75] Inventor: Lee D. Whetsel, Jr., Plano, Tex.

[73] Assignee: Texas Instruments Incorporated, Dallas, Tex.

[21] Appl. No.: 08/826,310

[22] Filed: Mar. 25, 1997

Related U.S. Application Data

[62] Division of application No. 08/476,003, Jun. 7, 1995, Pat. No. 5,631,911, which is a division of application No. 08/271,384, Jul. 6, 1994, abandoned, which is a continuation of application No. 08/186,486, Jan. 25, 1994, abandoned, which is a continuation of application No. 08/087,020, Jul. 6, 1993, abandoned, which is a continuation of application No. 07/970,529, Nov. 2, 1992, abandoned, which is a continuation of application No. 07/876,694, Apr. 28, 1992, abandoned, which is a continuation of application No. 07/609,124, Nov. 1, 1990, abandoned, which is a continuation of application No. 07/241,520, Sep. 7, 1988, abandoned.

[51] Int. Cl.⁷ .................................................. G01R 31/28
[52] U.S. Cl. ............................................................. 714/727
[58] Field of Search ................................... 714/727, 726, 714/729, 724, 728, 738

[56] References Cited

U.S. PATENT DOCUMENTS

| | | | |
|---|---|---|---|
| 4,833,676 | 5/1989 | Koo | 714/736 |
| 5,241,265 | 8/1993 | McDonnell et al. | 324/158.1 |
| 5,490,151 | 2/1996 | Feger et al. | 714/726 |
| 5,495,487 | 2/1996 | Whetsel, Jr. | 714/736 |
| 5,550,843 | 8/1996 | Yee | 714/726 |
| 5,719,876 | 2/1998 | Warren | 714/726 |

*Primary Examiner*—Hoa T. Nguyen
*Attorney, Agent, or Firm*—Lawrence J. Bassuk; Frederick J. Telecky

[57] ABSTRACT

A test cell (12) provides boundary scan testing in an integrated circuit (10). The test cell (12) comprises two memories, a flip-flop (24) and a latch (26), for storing test data. A first multiplexer (22) selectively connects one of a plurality of inputs to the flip-flop (24). The input of the latch (26) is connected to output of the flip-flop (24). The output of the latch (26) is connected to one input of a multiplexer (28), the second input to the multiplexer (28) being a data input (DIN) signal. A control bus (17) is provided for controlling the multiplexers (22, 28), flip-flop (24) and latch (26). The test cell allows input data to be observed and output data to be controlled simultaneously.

3 Claims, 10 Drawing Sheets

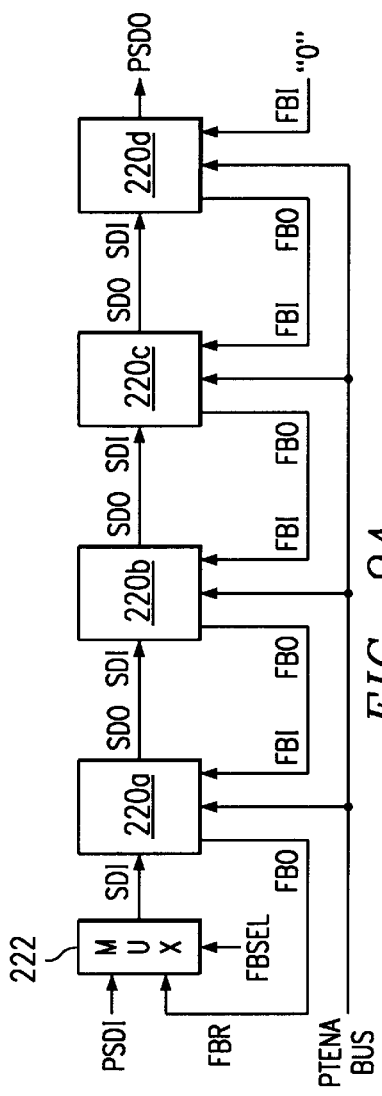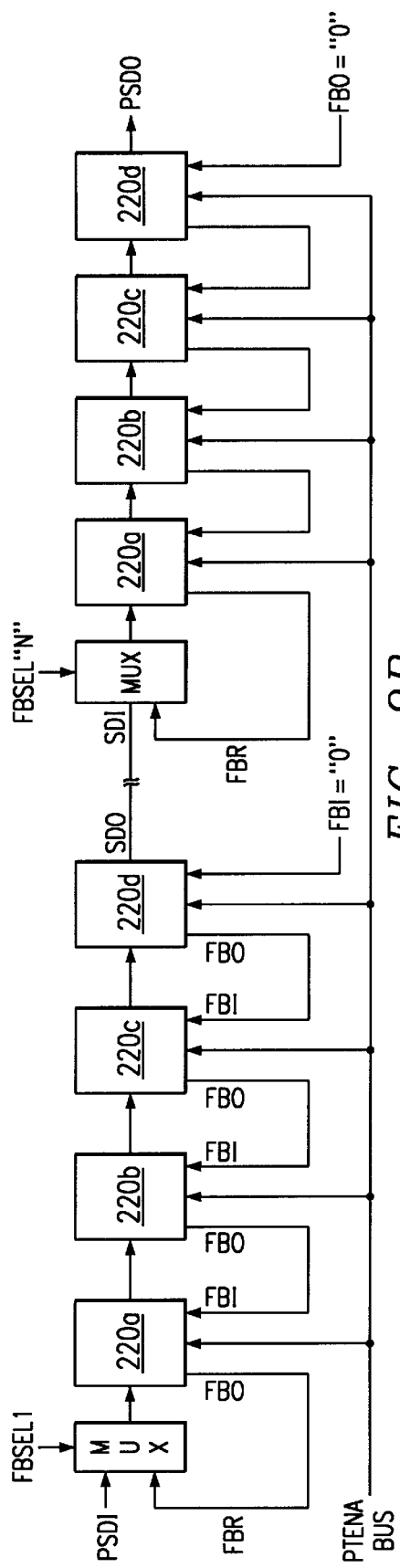

IC WITH TEST CELLS HAVING SEPARATE DATA AND TEST PATHS

This application is a divisional of application Ser. No. 08/476,003, filed Jun. 7, 1995, now U.S. Pat. No. 5,631,911; which was a divisional of application Ser. No. 08/271,384, filed Jul. 6, 1994, now abandoned; which was a continuation of application Ser. No. 08/186,486, filed Jan. 25, 1994, now abandoned; which was a continuation of application Ser. No. 08/087,020, filed Jul. 6, 1993, now abandoned; which was a continuation of application Ser. No. 07/970,529, filed Nov. 2, 1992, now abandoned; which was a continuation of application Ser. No. 07/876,694, filed Apr. 28, 1992, now abandoned; which was a continuation of application Ser. No. 07/609,124, filed Nov. 1, 1990, now abandoned; which was a continuation of application Ser. No. 07/241,520, filed Sep. 7, 1988, now abandoned.

This application is related to U.S. Pat. No. 5,495,487, Testing Buffer/Register, which is incorporated herein by reference.

This application is related to U.S. Pat. No. 5,084,874, Enhanced Test Circuit, which is incorporated herein by reference.

RELATED APPLICATIONS

This application is related to Ser. No. 07/241,439, filed Sep. 7, 1988, entitled "Testing Buffer/Register," now abandoned; which is incorporated herein by reference, and a continuation of which issued as U.S. Pat. No. 5,495,487.

This application is related to Ser. No. 07/241,511, filed Sep. 7, 1988, entitled "Enhanced Test Circuit," now abandoned; which is incorporated herein by reference, and a continuation of which issued as U.S. Pat. No. 5,084,874.

TECHNICAL FIELD OF THE INVENTION

This invention relates in general to integrated circuits, and more particularly to a test cell used in an integrated circuit for providing a boundary scan test structure.

BACKGROUND OF THE INVENTION

Due to advances in the fields of board interconnect technology, surface mount packaging and IC density, board level testability is becoming increasingly complex. The combination of advanced board interconnect technology, such as buried wire interconnects and double-sided boards, along with surface mount packaging creates problems for in-circuit testing of the boards. In-circuit testing, the most common board level testing method, depends upon the ability to physically probe the nodes of a circuit board. As board density (the number of ICs on a board) increases, the process of probing the board using traditional techniques becomes more difficult, due to the lack of physical access.

As the IC density (amount of logic on a chip) increases, the number of test patterns required for proper testing likewise increases. In-circuit testing relies on back-driving techniques to force input conditions to test a particular IC in a circuit. When such test is being applied to one IC on a board, neighboring ICs, whose output buffers are tied to the same nodes, may be damaged. The chance of damaging a neighboring IC increases with the length of time it takes to perform a test, which is directly related to the number of test patterns applied, and therefore, related to the IC density.

Therefore, a need has arisen in the industry to provide a test structure which provides access to particular ICs on a board, and allows testing of particular ICs without risk of damage to neighboring ICs.

SUMMARY OF THE INVENTION

In accordance with the present invention, a boundary scan test system is provided which substantially eliminates the disadvantages and problems associated with prior testing systems.

The boundary scan test system of the present invention comprises a first multiplexer connecting a plurality of inputs to a first memory, responsive to control signals provided by a control bus. The output of the first memory is connected to a second memory. The output of the second memory is connected to an input to a second multiplexer along with one or more other inputs. The second multiplexer is controlled by another control signal on the control bus. The output of the first memory and the output of second memory are connected to the first multiplexer as inputs.

The present invention provides a variety of functions for testing purposes. The test cell is operable to both reserve data inputs and control data outputs to and from the cell. The test cell may operate in two modes: "normal" mode and "testing" mode. In normal mode, the test cell provides a data path through which inputs and outputs may propagate freely through the test cell. While in the normal mode, the test cell can also load and shift test data, remain in an idle state, or toggle test data without disturbing the normal operation of the integrated circuit. Further, while in normal mode, a predetermined test data bit may be inserted into the data stream. Also, the test cell may perform a self-test while in the normal mode to insure correct operation of the test cell.

In the test mode, the test cell inhibits the normal flow of data through the test cell. Normally, the test cells in the integrated circuit will have been prepared to output an initial test pattern. While in the test mode, the test cell may perform Idle, Load, Shift, and Toggle operations.

The present invention provides significant advantages over the prior art. First, the test cell of the present invention may be used to perform internal and external boundary testing simultaneously, in order to reduce overall test time. Second, the test cells are capable of sampling or inserting data at the boundary during normal operation of the host integrated circuit. Third, the test cell is synchronous in operation with a free running test clock. Fourth, the present invention provides a method of toggling an IC's output buffers, independent of the IC's application logic, in order to achieve parametric measures and to facilitate boundary test. Fifth, the test cell provides self-testing capabilities.

BRIEF DESCRIPTION OF THE DRAWINGS

For a more complete understanding of the present invention and the advantages thereof, reference is now made to the following descriptions taken in conjunction with the accompanying drawings, in which:

FIGS. 9a–b illustrate interconnections between test circuits having programmable polynomial tap logic circuitry;

DETAILED DESCRIPTION OF THE INVENTION

The preferred embodiment of the present invention is best understood by referring to FIGS. 1–5 of the drawings, like numerals being used for like and corresponding parts of the various drawings.

Figure 1:
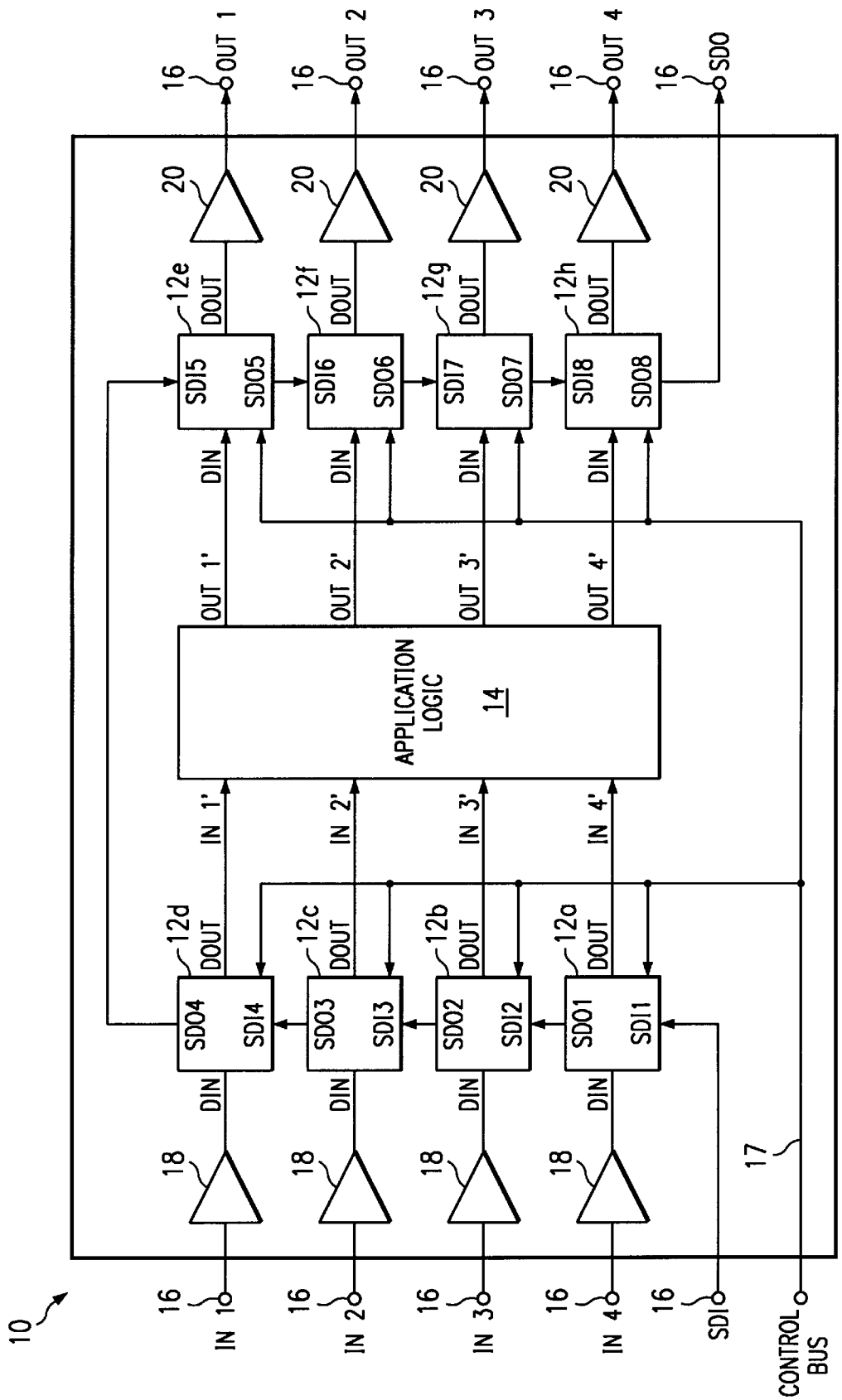
FIG. 1 illustrates circuit diagram of an integrated circuit having test cells disposed at the boundary of the internal application logic.

FIG. 1 illustrates a block diagram of an integrated circuit (IC) 10 having test cells 12a–h disposed about its boundary to control and observe data flow through the application logic 14 of the IC 10. The integrated circuit 10 comprises a plurality of pins 16 which provide an electrical connection between the integrated circuit 10 and other integrated circuits. For purposes of illustration, the integrated circuit 10 is shown with four pins receiving input signals, IN1, IN2, IN3 and IN4, and four pins providing output signals, OUT1, OUT2, OUT3 and OUT4. Other signals to the chip include a serial data input (SDI), a control bus 17, and a serial data output (SDO). The input signals IN1–IN4 are connected to input buffers 18 which output to respective test cells 12a–d. Each test cell 12a–h has its own serial data input and serial data output, enumerated SDI 1–8 and SDO 1–8. In the illustrated configuration, the SDI input to the IC 10 is connected to SDI1 of test cell 12a; the SDI inputs of subsequent cells 12b–h receive the SDO of the previous cell. Hence, SDO1 is connected to SDI2, SDO2 is connected to SDI3, and so on. SDO8 is connected to the SDO pin of the IC 10. The control bus 17 is connected in parallel to each of the test cells 12a–f.

Each test cell includes a data input (DIN) and a data output (DOUT). For the input test cells 12a–d, DIN is connected to the output of respective buffers 18 and DOUT is connected to the inputs of the application logic 14. The inputs of the application logic 14 are enumerated IN1'–IN4', corresponding to the inputs IN1–IN4. IN1'–IN4' would be the inputs to the chip were not the test structure provided.

The output from the application logic 14 are referenced as OUT1', OUT2', OUT3' and OUT4'. The outputs of the application logic OUT1'–OUT4' are connected to the data inputs (DINs) of the output test cells 12e–h. The data outputs (DOUTS) of the output test cells 12e–h are connected to output buffers 20 corresponding to OUT signals OUT1–OUT4.

The test cells 12a–h provide the basis for a great deal of test functionality within the integrated circuit 10. The SDI enters the IC 10 through test cell 12a and may propagate to each subsequent cell 12b–h, eventually being output from test cell 12h through SDO8. The serial data path is used to shift data into and out of each of the test cells 12a–h.

The control bus provides signals for operating each of the test cells 12a–h during testing, and is described in more detail in connection with FIGS. 2–3. When placed in a test mode, the test cells 12a–h inhibit the normal flow of data into and out of the IC 10. In the test mode, each test cell 12a–h controls the logic node attached to its output and observes the logic node attached to its input. For example, in FIG. 1, the test cells 12a–d attached to the four inputs IN1–IN4, can observe the logic levels on the IN1–IN4 inputs and control the logic levels on the IN1'–IN4' outputs. Similarly, the test cells 12e–h, connected to the four outputs can observe the logic levels on the OUT1'–OUT4' inputs and control the logic levels on the OUT1–OUT4 outputs.

Figure 2:
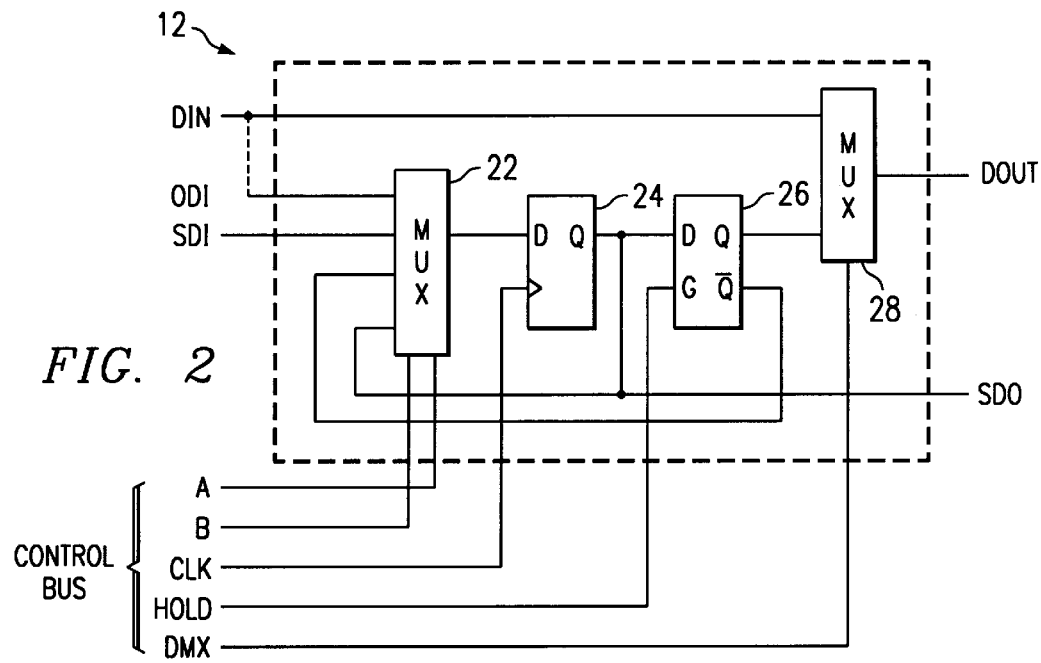
FIG. 2 illustrates a circuit diagram of a preferred embodiment of the test cell of the FIG. 1.

In FIG. 2, a detailed block diagram of an individual test cell 12 is provided. The test cell 12 has three data inputs: data in (DIN), observability data in (ODI), and serial data in (SDI). Two data outputs are provided: data out (DOUT) and serial data out (SDO). The control bus 17 comprises five signals, data input multiplexer selects, A and B, a register clock signal (CLK), a latch enable (HOLD), and a data output multiplexer select (DMX).

A first multiplexer 22 receives the ODI and SDI signals, along with the output of a D-type flip-flop 24 and the inverted output of a D-type latch 26. The output of the multiplexer 22 is connected to the input of the flip-flop 24. The CLK signal is connected to the flip-flop clock input. The output of the flip-flop 24 is connected to the input of the latch 26 and also provides the SDO signal. The output of the latch 26 is connected to the input of a second multiplexer 28 along with the DIN signal. The HOLD signal is connected to the latch enable. The output of the multiplexer 28 provides the DOUT signal. The multiplexer 28 is enabled by the DMX signal.

In operation, the 4:1 multiplexer 22 allows the input to the flip-flop 24 to be selected from one of four possible sources: ODI, SDI, the output of the flip-flop 24 or the inverted output of the latch 26. The latch 26 can be controlled to propagate the output of the flip-flop 24 or to hold its present state, depending upon the logic level applied by the HOLD input. The 2:1 multiplexer 28 allows the DOUT output to be driven by either the DIN input or the output of the latch 26, depending upon the logic level applied by the DMX input. The combination of the 4:1 multiplexer 22, flip-flop 24, latch 26 and 2:1 multiplexer allows the test cell 12 to operate in four synchronous modes: load, shift, toggle and idle.

In load mode, the test cell 12 clocks the logic state of the ODI input into the D flip-flop 24 through the multiplexer 22. The ODI input is coupled to a signal that is to be observed during tests and, in most cases, the ODI input will be attached to the same boundary signal that is connected to the test cell's DIN input. However, the ODI can be connected to other signals as well. To cause a load operation to occur, the A and B inputs are set to predetermined levels, allowing the ODI input to be connected to the flip-flop 24 via the 4:1 multiplexer 22. Normally, the HOLD input to the latch 26 is low, forcing the latch output to remain in its present state during a load operation.

In shift mode, the test cell clocks the logic state of the SDI input into the flip-flop 24 and outputs this logic state via the SDO output. The shift mode allows the test cells 12 in the boundary scan path to be interconnected together so that serial data can be shifted into and out of the boundary scan path. In a boundary scan configuration, the SDI input of the test cell is coupled to a preceding test cell's SDO output, as shown in FIG. 1. To cause the shift operation to occur, the A and B inputs are set to predetermined levels, allowing the SDI input to be connected to the flip-flop 24 via the 4:1 multiplexer. Normally, the HOLD input to the latch 26 is kept low, forcing the latch output to remain in its present state during the shift operation.

In toggle mode, the output of the flip-flop 24 toggles between two logic states at the rate of the CLK input, regardless of the condition of the SDI or ODI inputs. In this configuration, the HOLD input is set to a high logic level to enable the latch 26 and the A and B inputs are set such that the inverted output of the latch 26 is propagated to the flip-flop 24. With the control input set in this manner, a feedback path is formed from the output of the flip-flop 24 to the input of the latch 26 and from the inverted output of latch 26 to the input of the flip-flop 24. Because of the data inversion at the inverted output of the latch 26, the opposite logic state is clocked into the flip-flop 24 on each CLK input, creating the toggle effect.

In idle mode, the test cell remains in present state while the CLK is active, regardless of the condition of the SDI or ODI inputs. In this configuration, the output of the flip-flop 24 is passed through the 4:1 multiplexer 22; hence, the input of the flip-flop 24 is connected to its output, allowing the present state of the flip-flop 24 to be refreshed on every clock input.

The test cell 12 can be in either "normal" mode or "testing" mode. In normal mode, the test cell 12 provides the data path through which the inputs (IN1–IN4) and output (OUT1–OUT4) propagate freely. The normal mode is achieved by setting the DMX signal such that the DIN signal passes through the multiplexer 28 to DOUT. While in the normal mode, the test cell 12 can operate in any of the four synchronous modes (load, shift, idle or toggle) without disturbing the normal operation of the IC 10.

A control signal can be issued via the A and B inputs to cause the test cell 12 to execute a load operation. The load operation causes the test cell 12 to capture the logic level present on the ODI input. Once the data has been captured, it can be shifted out of the test cell 12 by performing a shift operation. The load operation occurs synchronous with the CLK input. Following the shift operation, the test cell 12 typically returns to the idle mode. This capability allows the test cell 12 to sample an IC's input and/or output boundary signals and shift the sample data out for inspection during normal operation of the IC. The ability to sample boundary data during normal operations allows the test cell 12 to verify the functional interactions of multiple ICs on a circuit board without having to use expensive test equipment and external test probes.

Also while in normal mode, control can be issued via the DMX input to cause the test cell 12 to insert a predetermined test data bit into the normal input/output boundary path of the IC. The test data bit to be inserted is shifted into the flip-flop 24 via a shift operation. The HOLD input to the latch 26 is set high to allow the test data in the flip-flop to pass through the latch and input to the 2:1 multiplexer 28. To insert the test data, the DMX input is set to a level causing the multiplexer to propagate the test data from the output of the latch 26 to the DOUT output. After the test data has been inserted, the DMX input is switched to cause the 2:1 multiplexer 28 to propagate normal data from DIN to DOUT.

The ability to insert test data during normal operations allows the test cells to modify the normal behavior of one or more ICs in a circuit. One particular usage of the insert capability is to propagate a fault into the input and/or output boundary of one or more ICs of a circuit board to see if the fault can be detected and corrected. In order to perform the sample and insert test functions during normal operation, the test cell 12 must receive control via the control bus 17 at a qualified point in time.

The test cell 12 can also perform a self-test while in the normal mode without disturbing the normal operation of the IC 10. A shift operation may be performed to initialize the flip-flop 24 to a known state. Following the shift operation, control is issued to cause the test cell 12 to enter the toggle mode for one CLK transition. During this transition, the flip-flop is loaded with the inverse of its state. Following this inversion of data, another shift operation is performed to retrieve the contents of the flip-flop 24 and verify the inversion operation. This test verifies the combined operation of each of the test cell's flip-flop 24, 4:1 multiplexer 22, and latch 26, along with the integrity of the overall boundary scan path.

In the test mode, the test cell 12 inhibits the normal flow of data from the DIN input to the DOUT output. The test mode is entered by setting the DMX input to a level such that the output of the latch 26 is connected to the DOUT output. Normally, prior to entering the test mode, the test cell 12 will have been prepared to output an initial test pattern, via a shift pattern. Also, the test cell 12 will usually be in an idle state and the HOLD input to the D latch will be set low, such that its present output is maintained.

While in the test mode, a load operation may be executed, causing the test cell 12 to capture the logic level present on the ODI input. The load operation occurs synchronous with the CLK input. During a load operation, the HOLD input is set low, such that the D latch remains in its present state. Likewise, the DOUT output remains in its present state, since it is driven by the latch output.

Following the load operation, a shift operation is performed, causing the test cell 12 to shift data through the flip-flop 24 from the SDI input to the SDO output. The shift operation allows the test cell to shift out the data captured during a previous load operation and shift in the next output test data to apply to the DOUT output. The shift operation occurs synchronous with the CLK input. During a shift operation, the HOLD input is held low, such that the output of the latch 26 remains in its present state. Likewise, the DOUT output remains in its present state, since it is driven by the latch output.

Following the load and shift operation sequence, the test cell 12 returns to the idle mode and the HOLD input will be set high, such that the latch 26 is updated with the new output test data residing in the flip-flop 24. When the latch 26 is updated, the new output test data is applied to the DOUT output. Following the update operation, the HOLD input is set low such that the latch 26 remains in its present state during subsequent load and shift operations.

The HOLD, load, shift, and update/apply sequence is repeated during boundary scan testing of the internal and external logic elements attached to the ICs test circuitry. By providing separate memory elements for output test control (i.e., latch 26) and input test observation and shifting (i.e., flip-flop 24), the test cell 12 can test the internal logic of an IC 10 and the external logic and/or wiring interconnects attached to the IC's boundary simultaneously. This feature reduces test time significantly.

While in the test mode, the test cell 12 can perform a toggle operation. Since the output of the latch 26 is coupled to the DOUT output during test mode, the DOUT output can be made to toggle at the rate of the CLK input when the toggle operation is performed. The advantage of using a D latch instead of a second D flip-flop is that the D latch can be made to propagate the Q output of the D flip-flop by setting the HOLD input high. The toggle mode can be used as a simple test pattern generator or for measuring parameters of the output buffers 20 of the IC 10.

Figure 3:
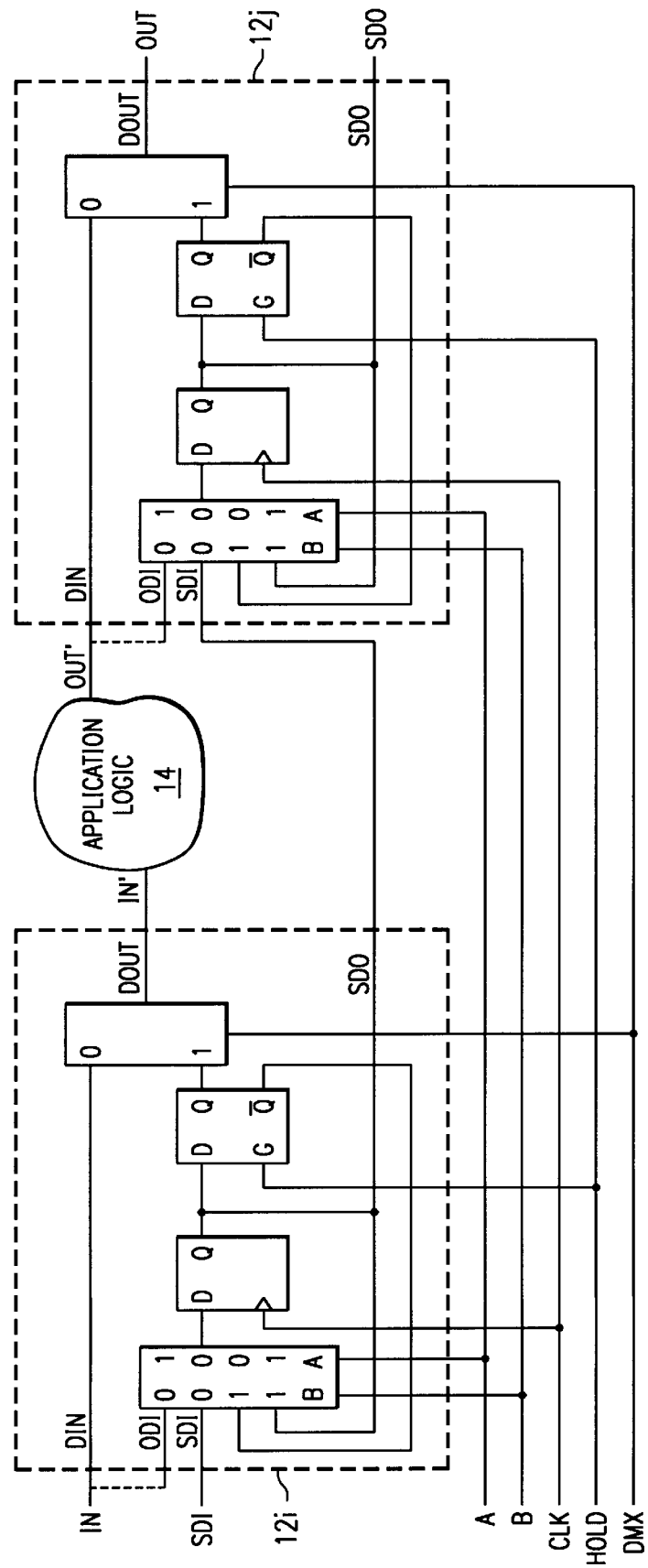
FIG. 3 illustrates a circuit diagram interconnections between test cells on an integrated circuit.

FIG. 3 illustrates a simplified view of an IC design having one input (IN), one output (OUT), an application logic section 14, and a boundary scan path consisting of two test cells 12i and 12j. The input to the application logic 14 is connected to the output of the 2:1 multiplexer 28 of test cell 12i, and is denoted as IN'. The output of the application logic is denoted as OUT' and is connected to the DIN and ODI signals of the test cell 12j.

The IN input enters the DIN input of the input test cell 12i, passes through the 2:1 multiplexer 28, and is output to the application logic 14 from the input test cells DOUT output, via IN'. Likewise, the application logic output, OUT', enters the DIN input of the output test cell 12j, passes through its 2:1 multiplexer 28, and is output from the IC from the output test cell DOUT output, via OUT. The ODI input of the input test cell 12i is attached to the ICs input (IN) and the ODI input of the output test cell 12j is attached to the application logic output (OUT'). The SDI input of the IC is coupled to the input test cell's SDI input and the IC serial data output (SDO) is coupled to the output test cell SDO output. A serial data path exists between the SDO of the input test cell 12i output and the SDI input of the output test cell 12j, creating an internal connection between the test cells for shifting data. The control bus signals (A, B, CLK, HOLD, and DMX) are connected to both test cells 12i and 12j, allowing both to operate together in a synchronous manner.

In the normal mode, data flows into the application logic 14 from the IN to the IN' via the input test cell 12i, and flows from the application logic from OUT' to OUT via the output test cell 12j. The following examples describe the sequence of control signals issued via the control bus 17 to cause the test cells 12i and 12j to perform a sample and an insert test operation at the boundary of the IC in FIG. 3 during normal operation.

SAMPLE OPERATIONS SEQUENCE

1) Initially both test cells are in Normal Mode and Idle Mode
   Control Bus: DMX=0, BA=11, HOLD=0, CLK=Active
   (where BA equals the select control signals issued to the 4:1 multiplexor 22)
   Application Logic's IN' input is driven by the IC's IN input
   IC's OUT output is driven by the Application Logic's OUT' output
   Both test cells' D latches remain in their present state
   Both test cells' D flip-flops remain in their present state
2) Enter Load Mode for one CLK to capture input and output boundary data
   Control Bus: DMX=0, BA=01, HOLD=0, CLK=Active
   Application Logic's IN' input is driven by the IC's IN input
   IC's OUT output is driven by the Application Logic's OUT' output
   Both test cells' D latches remains in their present state
   Both test cells' D flip-flops clock in the logic level on their ODI input
3) Enter Shift Mode for two CLKs to shift out captured data
   Control Bus: DMX=0, BA=00, HOLD=0, CLK=Active
   Application Logic's IN' input is driven by the IC's IN input
   IC's OUT output is driven by the Application Logic's OUT' output
   Both test cells' D latches remains in their present state
   Both test cells' D flip-flops clock in the logic level on their SDI input
4) Enter Idle mode, test complete
   Control Bus: DMX=0, BA=11, HOLD=0, CLK=Active
   Application Logic's IN' input is driven by the IC's IN input
   IC's OUT output is driven by the Application Logic's OUT' output
   Both test cells' D latches remains in their present state
   Both test cells' D flip-flops remain in their present state

TEST DATA INSERT OPERATION SEQUENCE

1) Initially both test cells are in Normal Mode and Idle Mode
   Control Bus: DMX=0, BA=11, HOLD=0, CLK=Active
   Application Logic's IN' input is driven by the IC's IN input
   IC's OUT output is driven by the Application Logic's OUT' output
   Both test cells' D latches remain in their present state
   Both test cells' D flip-flops remain in their present state
2) Enter Shift Mode for two CLKs to load test data to insert
   Control Bus: DMX=0, BA=00, HOLD=0, CLK=Active
   Application Logic's IN' input is driven by the IC's IN input
   IC's OUT output is driven by the Application Logic's OUT' output
   Both test cells' D latches remains in their present state
   Both test cells' D flip-flops clock in the logic level on their SDI input
3) Enter Idle Mode and update both test cells' D latches with test data to insert
   Control Bus: DMX=0, BA=11, HOLD="0,1,0", CLK=Active
   Application Logic's IN' input is driven by the IC's IN input
   IC's OUT output is driven by the Application Logic's OUT' output
   Both test cells' D latches update to the logic level in the D flip-flops
   Both test cells' D flip-flops remain in their present state
4) Remain in Idle Mode, set DMX high to insert test data
   Control Bus: DMX=1, BA=11, HOLD=0, CLK=Active
   Application Logic's IN' input is driven by input test cells' D latch
   IC's OUT output is driven by output test cells' D latch
   Both test cells' D latches remain in their present state Both test cells' D flip-flops remain in their present state 5) Remain in Idle Mode, set DMX low to remove test data, test complete Control Bus: DMX=0, BA=11, HOLD=0, CLK=Active Application Logic's IN' input is driven by the IC's IN input IC's OUT output is driven by the Application Logic's OUT' output Both test cells' D latches remain in their present state Both test cells' D flip-flops remain in their present state During test mode, the normal flow of input and output data through the test cells 12i and 12j is inhibited. In the test mode, the input test cell 12i controls the IN' input to the application logic and observes the IN input to the IC. Likewise, the output test cell 12j controls the OUT output from the IC 10 and observes the OUT' output from the application logic. The following examples describe the sequence of control issued via the control bus to cause the test cells 12i and 12j to perform a boundary scan test and output buffer toggle operation.

BOUNDARY SCAN TEST OPERATION SEQUENCE

1) Initially both test cells are in Normal Mode and Idle Mode

Control Bus: DMX=0, BA=11, HOLD=0, CLK=Active

Application Logic's IN' input is driven by the IC's IN input

IC's OUT output is driven by the Application Logic's OUT' output

Both test cells' D latches remain in their present state

Both test cells' D flip-flops remain in their present state

2) Enter Shift Mode for two CLKs to shift in the first output test pattern

Control Bus: DMX=0, BA=00, HOLD=0, CLK=Active

Application Logic's IN' input is driven by the IC's IN input

IC's OUT output is driven by the Application Logic's OUT' output

Both test cells' D latches remains in their present state

Both test cells' D flip-flops clock in the logic level on their SDI input

3) Enter Idle Mode, update D latches with first output test pattern

Control Bus: DMX=0, BA=11, HOLD="0,1,0", CLK=Active

Application Logic's IN' input is driven by the IC's IN input

IC's OUT output is driven by the Application Logic's OUT' output

Both test cells' D latches update to the logic level in the D flip-flops

Both test cells' D flip-flops remain in their present state

4) Remain in Idle Mode, enter Test Mode, apply first output test pattern

Control Bus: DMX=1, BA=11, HOLD=0, CLK=Active

Application Logic's IN' input is driven by input test cells' D latch

IC's OUT output is driven by output test cells' D latch

Both test cells' D latches remains in their present state

Both test cells' D flip-flops remain in their present state

5) Enter Load Mode for one CLK to capture input and output boundary data

Control Bus: DMX=1, BA=01, HOLD=0, CLK=Active

Application Logic's IN' input is driven by input test cells' D latch

IC's OUT output is driven by output test cells' D latch

Both test cells' D latches remains in their present state

Both test cells' D flip-flops clock in the logic level on their ODI input

6) Enter Shift Mode for two CLKs to shift out captured data and shift in next output test pattern Control Bus: DMX=1, BA=00, HOLD=0, CLK=Active Application Logic's IN' input is driven by input test cells' D latch IC's OUT output is driven by output test cells' D latch Both test cells' D latches remains in its present state Both test cells' D flip-flops clock in the logic level on their SDI input 7) Enter Idle Mode, update D latches to apply next output test pattern Control Bus: DMX=1, BA=11, HOLD="0,1,0", CLK=Active Application Logic's IN' input is driven by input test cells' D latch IC's OUT output is driven by output test cells' D latch Both test cells' D latches update to logic level to the D flip-flops Both test cells' D flip-flops remain in their present state 8) Repeat steps 5 through 1 until boundary test is complete, then issue control to return to Normal mode and Idle mode (Step 1)

OUTPUT BUFFER TOGGLE OPERATION SEQUENCE

1) Initially both test cells are in Normal Mode and Idle Mode

Control Bus: DMX=0, BA=11, HOLD=0, CLK=Active

Application Logic's IN' input is driven by the IC's IN input

IC's OUT output is driven by the Application Logic's OUT' output

Both test cells' D latches remain in their present state

Both test cells' D flip-flops remain in their present state

2) Enter Shift Mode for two CLKs to shift in the output buffer toggle pattern

Control Bus: DMX=0, BA=00, HOLD=0, CLK=Active

Application Logic's IN' input is driven by the IC's IN input

IC's OUT output is driven by the Application Logic's OUT' output

Both test cells' D latches remains in their present state

Both test cells' D flip-flops clock in the logic level on their SDI input

3) Enter Idle Mode, update D latches with output test pattern

Control Bus: DMX=0, BA=11, HOLD="0,1,0", CLK=Active

Application Logic's IN' input is driven by the IC's IN input

IC's OUT output is driven by the Application Logic's OUT' output

Both test cells' D latches update to the logic level in the D flip-flops

Both test cells' D flip-flops remain in their present state
4) Remain in Idle Mode, enter Test Mode, apply output test pattern Control Bus: DMX=1, BA=11, HOLD=0, CLK=Active Application Logic's IN' input is driven by input test cells' D latch IC's OUT output is driven by output test cells' D latch Both test cells' D latches remains in their present state Both test cells' D flip-flops remain in their present state 5) Enter Toggle Mode, Set HOLD input high, Toggle test begins (for "N" clock inputs)

Control Bus: DMX=1, BA=10, HOLD=1, CLK=Active

Application Logic's IN' input is driven by input test cells' D latch

IC's OUT output is driven by output test cells' D latch

Both test cells' D latches pass data from D flip-flop to DOUT output

Both test cells' D flip-flops clock in the Q-D latch output

6) Enter Idle Mode, Set HOLD and DMX input low, Toggle test complete

Control Bus: DMX=0, BA=11, HOLD=0, CLK=Active

Application Logic's IN' input is driven by the IC's IN input

IC's OUT output is driven by the Application Logic's OUT' output

Both test cells' D latches remain in their present state

Both test cells' D flip-flops remain in their present state

NOTE: In FIG. 3, if it is desired not to toggle the input test cell during the Toggle test, a separate HOLD input can be used to force the output of the input test cell to be static while the output test cell toggles. Likewise separate control (A and B) can cause the input test cell into an Idle mode while the output test cell is toggling.

Figure 4A:
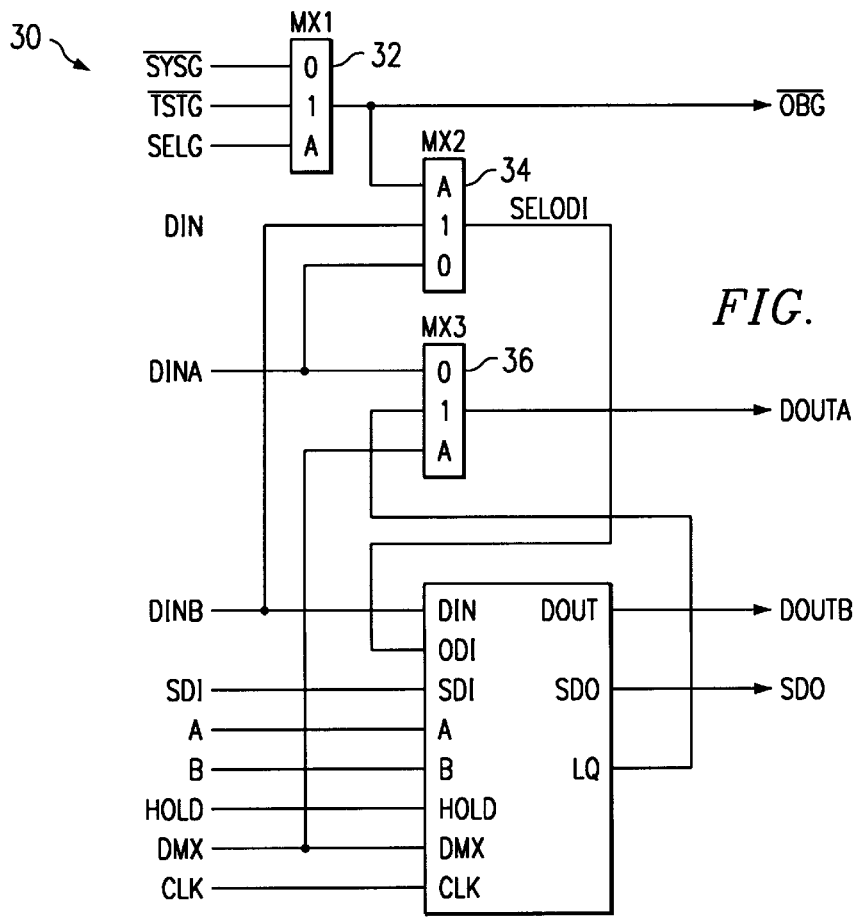
FIG. 4a illustrates a circuit diagram of a preferred embodiment of a bidirectional test cell.

Referring now to FIG. 4a, a block diagram of a preferred implementation of a bidirectional test cell 30 is illustrated. The bidirectional test cell 30 may be used in connection with an input/output pin, through which signals may flow in both directions. The bidirectional cell 30 uses the test cell 12 illustrated in FIG. 2 as a base cell, adding additional circuitry to provide bidirectional operation. Specifically, the bidirectional cell 30 provides three additional multiplexers 32, 34 and 36. The first multiplexer 32 has two inputs SYSG (the system tristate enable) and TSTG (the test tristate enable). The multiplexer is controlled by a SELG (select enable) signal, which selects one of the two inputs. The output of the first multiplexer 32 is the OBG (output buffer tristate enable). The OBG signal controls the output state of the IC's tristate output buffer.

The second multiplexer 34 receives two inputs, a DINA signal and a DINB signal. The multiplexer 34 is controlled by the output of the multiplexer 32, the OBG signal. The DINA input is an output from the IC's application logic 14 and the DINB input is the external input from the I/O buffer. The OBG signal output from the multiplexer 32 is used to select between inputs of the multiplexer 34.

The third multiplexer 36 has two inputs, DINA and the non-inverted output (LQ) from the latch 26 of the base test cell 12. This third multiplexer 36 is controlled by the DMX signal.

The output of the second multiplexer 34 is connected to the ODI input of the base test cell 12. The output of the third multiplexer 36 is denoted as DOUTA and the DOUT signal from the base test cell 12 is denoted as DOUTB.

In operation, the OBG output is driven by the SYSG input (normal mode tristate control input) when the SELG input is low. When the SELG input is high, the OBG output of the first multiplexer 32 is driven by the TSTG input (test mode tristate control input). In FIG. 4a, it is assumed that a low output on the OBG signal will cause an output buffer to be active and high output on the OBG signal will cause an output buffer to be tristate.

The second multiplexer 34 is controlled by the OBG output from the first multiplexer 32. The purpose of the second multiplexer is to couple one of the two data inputs, DINA or DINB, to the ODI input of the base test cell, to allow the appropriate signal to be sampled during a load operation. The DINA input to the second multiplexer 34 is an output from the application logic. When the second multiplexer's select input OBG is set low, indicating an output operation from the application logic, the DINA signal is coupled to the ODI input of the base test cell 12 and can be sampled during a load operation. When the second multiplexer's select input OBG is set high, indicating an input operation to the application logic, the DINB signal is coupled to the ODI input of the test cell 12 and can be sampled during a load operation. The third multiplexer 36 is controlled by the DMX signal, also sent to the test cell 12. The LQ output of the test cell 12 is the output of the D latch 26 inside the test cell 12. The LQ output allows holding the DOUTA output signal constant in test mode during load and shift operations. When the DMX input to the test cell 12 and third multiplexer 36 is set low, the bidirectional cell 30 is in normal mode. In the normal mode, the DINA output passes through the third multiplexer 36 and is output from the cell via the DOUTA output, establishing the normal data output path from the application logic 14 to the output buffer section of an I/O buffer. Likewise, in the normal mode, the DINB input passes through the 2:1 multiplexer 28 within the test cell 12 and is output from the cell via the DOUTB output, establishing the normal data input path from the input buffer section of an I/O buffer to the application logic 14.

When the DMX input to the test cell 12 and third multiplexer 36 is set high, the bidirectional test cell 30 is placed in the test mode. In the test mode, the test cell LQ test data output passes through the third multiplexer 36 is output from the scope cell via the DOUTA output, establishing the test data output path from the test cell 12 to the output buffer section of an I/O buffer. Likewise, in the test mode, the internal test cells LQ test data output passes through the test cell's internal 2:1 multiplexer 28 and is output from the test cell 12 via the DOUTB output, establishing the test data output path from the test cell to the application logic 14.

Figure 4B:
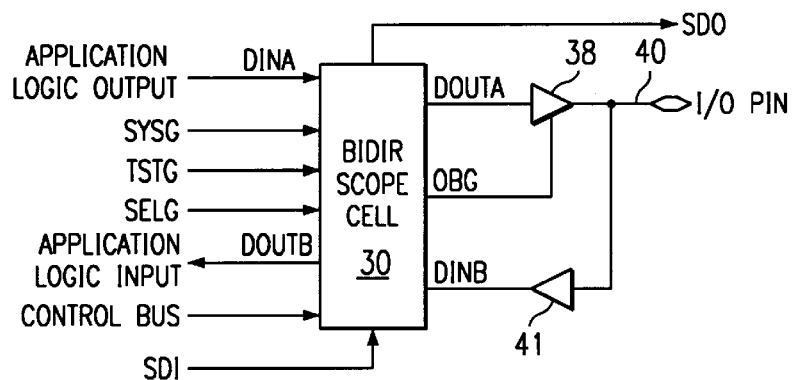
FIG. 4b illustrates a diagram of the bidirectional test cell of FIG. 4a as disposed within an integrated circuit.

In FIG. 4b, a block representation of bidirectional test cell 30 is shown connected between a bidirectional buffer and application logic 14. When a data output operation is performed, the output buffer 38 is enabled by OBG. In the normal mode, the data from the application logic 14 enters the bidirectional test cell 30 via the DINA input, passes through the bidirectional test cell 30 and is coupled to the output buffer 38 via the DOUTA output. The DOUTA output passes through the output buffer 38 and is applied to the I/O pin 40. In test mode, the test data stored in the bidirectional test cell 30 is supplied to the output buffer via the DOUTA output, passes through the output buffer 38 and is applied to I/O pin 40.

When a data input operation is performed, the output buffer is placed in a high impedance state by the OBG signal. In normal mode, the data from the I/O pin 40 enters the bidirectional test cell 30 via the input buffer 41 and the DINB input, passes through the test cell 30, and is applied to the application logic via the DOUTB output. In test mode, the test data stored in the test cell 30 is applied to the application logic by the DOUTB output.

Figure 5:
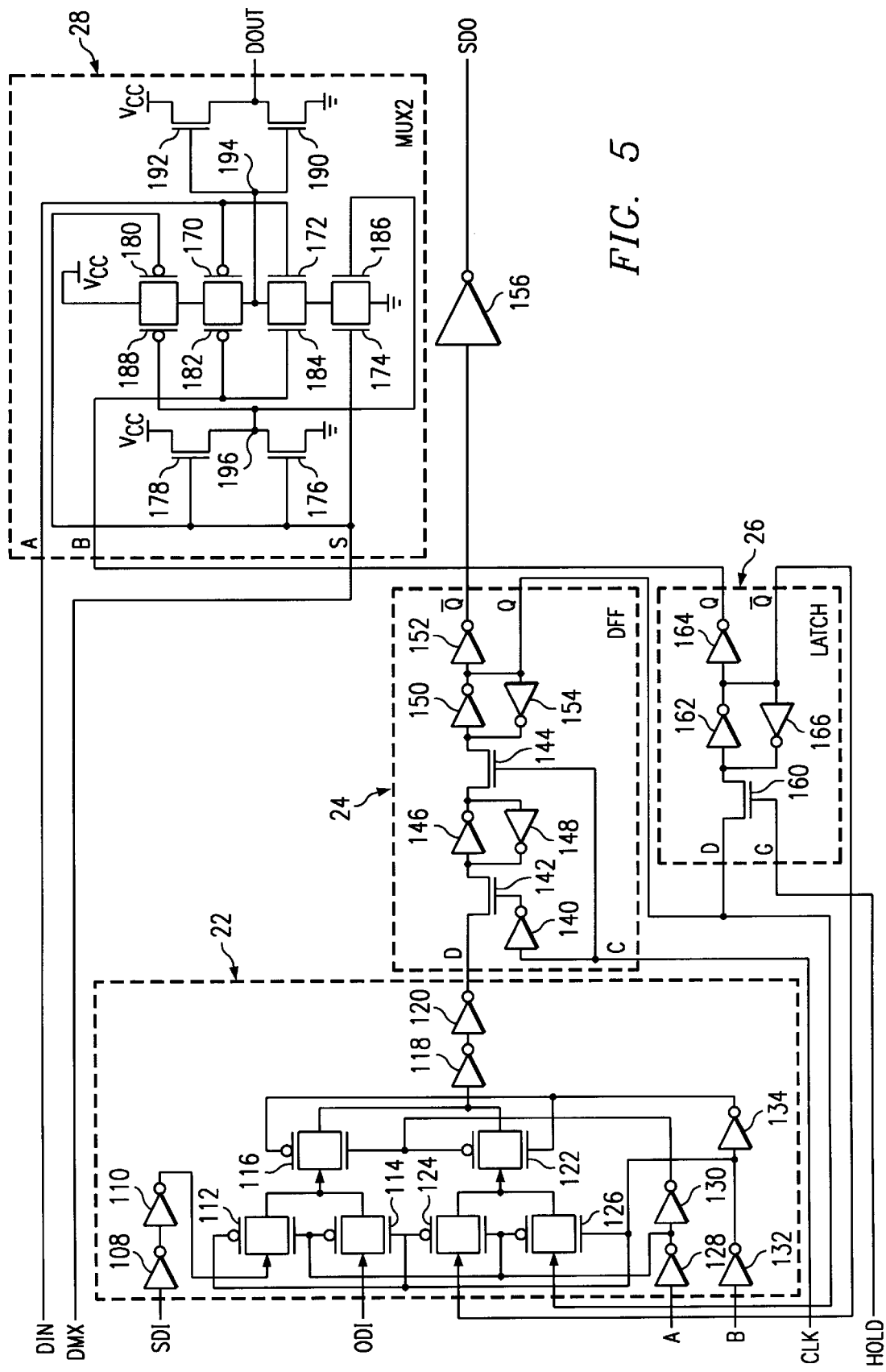
FIG. 5 illustrates an implementation of the test cell of the present invention.

Referring now to FIG. 5, there is shown a schematic diagram representing a particular implementation of the test cell 12. The implementation comprises multiplexers 22 and 28, D flip-flop 24 and latch 26.

The first multiplexer 22 has six independent input signals. The SDI signal is input to two cascaded inverters 108 and 110. The resulting output from inverter 110 is then input to a transmission gate 112. A transmission gate is formed by tying both the sources and drains of a P channel transistor to an N channel transistor. The output of transmission gate 112 is tied to the output of transmission gate 114 and to the input to transmission gate 116. The output of transmission gate 116 is likewise tied to the output of transmission gate 122 and to the input to a pair of cascaded inverters 118 and 120. This output at inverter 120 represents the final output from multiplexer 22.

The ODI input to multiplexer 22 is connected to transmission gate 114. The output of transmission gate 114 is tied to the output of transmission gate 112 and to the input to transmission gate 116.

A third input to multiplexer 22 is the inverted output of latch 26. This signal is input into transmission gate 124. The output of transmission gate 124 is tied to the output of transmission gate 126 and to the input to transmission gate 122.

A fourth input to multiplexer 22 is the output of the D flip-flop 24. This signal is input to transmission gate 126. The output of transmission gate 126 is then tied to the output of transmission gate 124 and to the input to transmission gate 122. The resultant output from transmission gate 122 is then tied to the output transmission gate 116.

The two remaining inputs of multiplexer 22 act as select signals for the various transmission gates within the multiplexer 22. Input signal A is first connected to inverter 128. The output of inverter 128 is then connected to the input of inverter 130. Additionally, the output of inverter 128 is further connected to the P channel gate of transmission gates 114 and 126. The same output is connected to the N channel gate of transmission gates 112 and 124. The output of inverter 130 is connected to the P channel gate of transmission gates 112 and 124 and the N channel gate of transmission gates 114 and 126.

The B input to multiplexer 22 is also used as a select signal. The B input is connected to inverter 132. The output of inverter 132 is connected to inverter 134. Additionally, the output of inverter 132 is connected to the P channel gate of transmission gate 122 and the N channel gate of transmission gate 116. The output of inverter 134 is connected to the N channel gate of transmission gate 122 and the P channel gate of transmission gate 116.

The D flip-flop 24 is connected to both a clock input CLK and the output of multiplexer 22. Within the D flip-flop 24, the clock signal is input to inverter 140, whose output is used to control the gate of N channel transistor 142. The clock signal is also used to control the gate of N channel transistor 144. The D input of D flip-flop 24 is connected to the first source/drain of N channel transistor 142. The second source/drain of transistor 142 is connected to the input of inverter 146. The output of inverter 146 is connected to the first source/drain of N channel transistor 144 and also to the input of inverter 148. The output of inverter 148 is connected to the input of inverter 146. The second source/drain of transistor 144 is connected to the input of inverter 150. The output of inverter 150 is connected both to the input of inverter 152 and the input of inverter 154. The output of inverter 154 is connected to the input of inverter 150. The output of inverter 150 is also connected to the input of the transmission gate 126. The output of inverter 152 is the inverted output of the D flip-flop 24. The inverted output of D flip-flop 24 is then input to inverter 156. The output of inverter 156 is the SDO output of the test cell.

The output of D flip-flop 24 (output of inverter 150) is connected to the D input of latch 26. This input is connected to the first source/drain of N channel transistor 160. The second source/drain of N channel transistor 160 is connected to the input of inverter 162. Within latch 26, the output of inverter 162 is connected to the input of inverter 166 and inverter 164. The output of inverter 166 is connected to the input of inverter 162. The output of inverter 162 also represents the inverted output of latch 26. As mentioned above, this inverted output is connected to multiplexer 22 through transmission gate 124. The output of inverter 164 represents the non-inverted output of the latch 26, which is connected to multiplexer 28. The latch 26 is also controlled by a hold voltage input to the base of N channel transistor 160.

The second multiplexer 28 within the test cell has three separate inputs, DIN, the output of inverter 164, and DMX. The DIN signal is connected to the one gates of P channel transistor 170 and N channel transistor 172. The output of inverter 164 is connected to the gate of P channel transistor 182 and N channel transistor 184. The DMX input is connected to the gates of N channel transistor 174, 176 and 178, and also to the gate of P channel transistor 180. The first source/drain of N channel transistor 178 is connected to $V_{cc}$ while the second source/drain is connected to node 196. Similarly, the first source/drain of N channel transistor 176 is connected to ground while the second source/drain is connected to node 196. Node 196 is further connected to the gate of P channel transistor 188 and the gate of N channel transistor 186. The first source/drain of P channel transistors 188 and 180 are tied and connected to $V_{cc}$. The second source/drain of P channel transistors 188 and 180 are connected to the first source/drain of P channel transistors 182 and 170, respectively. The second source/drain of P channel transistors 182 and 170 are tied and connected to node 194. The first source/drain of N channel transistors 184 and 172 are tied and are further connected to node 194. The second source/drain of N channel transistors 184 and 172 are connected to the first source/drain of N channel transistors 174 and 186, respectively. The second source/drain of N channel transistors 174 and 186 are connected to ground. Node 196 is also connected to the gates of N channel transistors 192 and 190. The first source/drain of N channel transistor 192 is connected to $V_{cc}$ The second source/drain of N channel transistor 192 is connected to the first source/drain of N channel transistor 190 and this combined signal represents the DOUT signal of the test cell. The second source/drain of N channel transistor 190 is connected to ground.

The present invention retains high speed performance on the observability data input (ODI), maintains a zero hold time on the shift data input (SDI), increases the setup time on SDI and increases the propagation delay from the clock transition to the SDO output. A zero hold time on SDI eliminates any abnormal data propagation problem in a cascaded configuration. A large setup time on SDI and a slight increase on the clock-to-Q delay enhances the clock skew margin to eliminate propagation errors due to skew between the various components of the test cell.

Two weak inverters 108 and 110 are used in the first multiplexer 22 in order to slow the serial data input and therefore increase the setup time. Since these inverters apply only to the SDI input, no performance degradation to the ODI input is introduced by this method. Another two inverters 150 and 152 are inserted in the output path of SDO to slightly increase the clock-to-Q propagation delay. A SPICE characterization shows that the invention has min/max SDI setup of 2/14 nanoseconds, a zero SDI hold time and min/max clock-to-Q delay of 0.96/5.96 nanoseconds. This data leads to a min/max clock skew margin of 2.96/19.96 nanoseconds.

The test cells of the present invention provide significant advantages over the prior art. First, the test cell of the present invention may be used to perform internal and external boundary testing simultaneously in order to reduce overall test time. Second, the test cells are capable of sampling or inserting data at the boundary during normal operation of the host integrated circuit. Third, the test cell is synchronous in operation with a free running test clock. Fourth, the present invention provides a method of toggling an IC's output buffers, independent of the IC's application logic, in order to achieve parametric measures and to facilitate boundary tests. Fifth, the test cell provides self-testing capability.

The functionality of the test cell 12 of the present invention may be enhanced through the use of cell libraries, in which additional circuitry may be provided on one or more of the test cells 12 used in IC 10 to provide an enhanced test circuit. A library of such circuits may be provided to enable a circuit designer to customize a particular IC 10.

Figure 6:
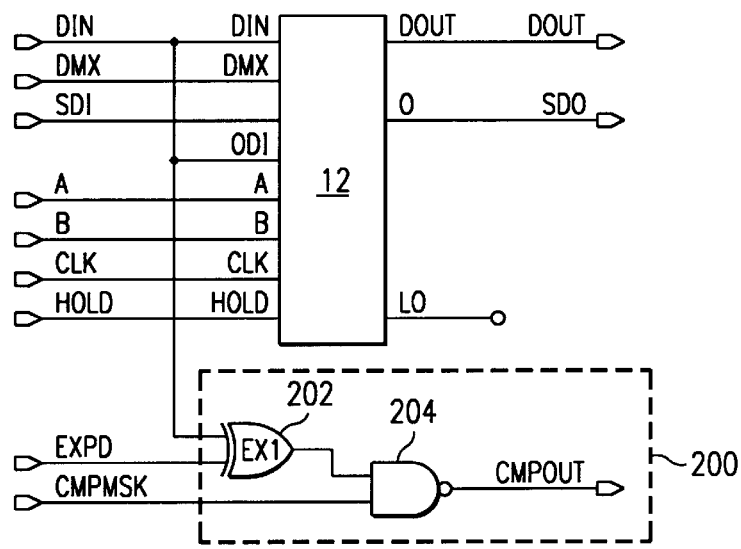
FIG. 6 illustrates a test circuit comprising a base test cell with compare logic circuitry.

Referring to FIG. 6, a maskable comparator logic section 200 is shown in connection with the test cell 12 of the present invention. The maskable comparator logic section 200 adds comparability test features for effectuating a test in response to a condition.

The maskable comparator logic section 200 comprises XOR gate 202 and a NAND 204. The XOR gate 202 has two inputs: a first input connected to the DIN and ODI inputs to the test cell 12 and a second input connected to an expected data (EXPD) signal. The NAND 204 also has two inputs: one input connected to the output of the XOR gate 202 and a second input connected to a compare mask (CMPMSK) signal. The output of the NAND gate 204 provides a compare output (CMPOUT) signal.

The maskable comparator logic 200 provides a means to compare logic level appearing at the DIN input of the test cell 12 against a predetermined logic level appearing at the EXPD input. If the logic level on the DIN input and the EXPD input match, the output of the exclusive OR gate will driven low. If the logic level on the DIN input and the EXPD input do not match, the output of the exclusive OR gate will be driven high. A low level output (match condition) from the exclusive OR gate will cause the NAND gate to output a high level via the CMPOUT output. The high level output (no match) from the exclusive OR gate 202 will cause the NAND gate 204 to output a low logic level via the CMPOUT output, unless the CMPMSK input to the NAND gate 204 is at a low level.

A high logic level on the CMPOUT output of the comparator logic section 200 indicates that the input or output boundary signal passing through this particular test cell is equal to an expected condition. By having similar test cells at every input and output signal of an integrated circuit, along with logic to detect the condition where all the CMPOUT signals from the various test cells are high, it is possible to detect the occurrence of an expected boundary condition over the entire range of an integrated circuit's inputs and outputs.

In some boundary compare applications, the condition of one or more of the integrated circuits inputs and/or outputs may be irrelevant. In these circumstances, the comparator logic 200 may be forced to mask off the compare operation and output a high level on the CMPOUT output regardless of the result of the compare operation. This capability allows for "Don't Care" comparison conditions to be set around the boundary of an integrated circuit design. The Don't Care condition is achieved by setting the CMPMSK of a particular test cell to a low logic level. All test cells having a low level applied to their CMPMSK input will output a high logic level from their CMPOUT output. By forcing the CMPOUT output high, the test cells with Don't Care conditions do not influence the overall result of a comparison taking place in other test cells at the boundary of an integrated circuit.

In some applications, the test cells may be required to provide Pseudo-Random Pattern Generation (PRPG) and/or Parallel Signature Analysis (PSA) capabilities at the boundary of an integrated circuit to facilitate testing. In the PRPG mode, a series of serially interconnected test cells can be made to generate a pseudo-random output pattern sequence from the DOUT outputs. In the PSA mode, a series of serially interconnected test cells can be made to compress the data appearing at the DIN input into a "signature" for testing purposes.

Figure 7:
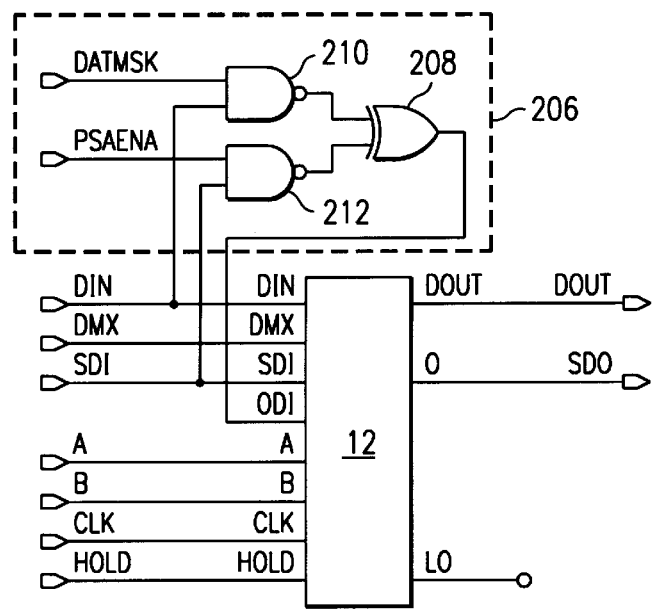
FIG. 7 illustrates a test circuit comprising a base test cell with PRPG/PSA logic circuitry.

A preferred implementation of a library cell capable of implementing PSA test logic is shown in FIG. 7. The inputs and output of the base test cell 12 comprises the signals described in connection with FIG. 2. Additionally, the PSA logic section 206 receives two input signals, Data Mask (DATMSK) and PSA Enable (PSAENA). The DATMSK and PSAENA inputs are extensions of the control bus.

The PSA logic section 206 comprises an Exclusive OR gate 208 and two NAND gates, 210 and 212. The NAND 210 is connected to the DATMSK signal and the DIN input signal. The NAND gate 212 is connected to the PSAENA signal and the SDI signal. The outputs of the NAND gate 210 and 212 are connected to the inputs of the Exclusive OR gate 208. The output the Exclusive OR gate is connected to the ODI input of the base test cell 12.

When the PSA logic section 206 is attached to the base cell 12, the normal connection of the ODI input to the DIN input is modified such that it is no longer a direct interconnect. However, the base function of capturing test data during a load operation via the ODI input is still valid, but addition rules set forth below and signal routing is required to accommodate the load operation via the PSA test logic. All other functions (idle, shift and toggle) and their required cell to cell interconnects remain the same.

To achieve the basic load operation, the DATMSK and PSAENA inputs to the logic section 206 are set to a high and low logic level, respectively. In this condition, the PSA logic section provides a routing path from the DIN input, through the NATID gate 210 and the Exclusive OR gate 208 to the ODI input of the base test cell 12. When the load operation is issued, the test cell 12 captures the logic level on the DIN input via the routing channel through the PSA logic section 206.

When a PSA operation is to be performed by the test cell, the MSKDAT and PSAENA inputs are both set to a high logic level and control is issued to the base test cell 12 to perform a load operation. With the MSKDAT and PSAENA inputs set in this manner, the PSA logic section 206 performs an Exclusive OR operation on the logic levels present on the DIN and SDI inputs, and outputs the result to the ODI input of the test cell 12. During the load operation, the test cell 12 samples the ODI input, storing the result of the Exclusive OR operation. The local Exclusive OR and load operation performed in each test cell 12, in combination with the required cell to cell interconnect for serial shifting (i.e., the SDI of one cell connected to the SDO of another) and polynomial feedback, forms the basis from which a boundary scan signature analysis structure can be implemented.

During a PSA operation, the PSA logic section 206 provides a means to mask off the effect of the DIN input on the Exclusive OR operation. The masking is achieved by setting the MSKDAT input low while leaving the PSAENA input high. When the MSKDAT input is set low, the PSA logic section 206 couples the SDI input to the ODI input of the test cell 12 and only the value of a preceding cell's SDO output is sampled and stored in the test cell 12. This capability allows masking out the signal attached to the DIN input of one or more of the test cells during a PSA operation at the boundary of an integrated circuit.

When a PRPG operation is to be performed by the test cell, control is issued to cause the test cell 12 to perform a shift operation from the SDI input to the SDO output.

During PRPG, data is shifted through a series of test cells 12 to produce a pseudo random output pattern. The resulting pseudo random pattern generation output is determined by the length of the scan path and the polynomial feedback connections of the test cells 12 in the scan path. Also, the hold and DMX inputs to the test cell will be set high, allowing the generated test signal to be driven out of the test cell's DOUT output.

In applications using test cells with PRPG and/or PSA test features, it is beneficial to provide a Programmable Polynomial Tap to allow the adjusting the polynomial feedback connection between the test cells 12 to suite a particular group or range of test cells at the boundary of an integrated circuit. The advantages of including this feature are: (1) simplification of the implementation of test cells in an integrated circuit design, (2) elimination of the need to add external polynomial tap capability, and (3) improvement of the placement and signal routing of test cells in an integrated circuit layout, since all the required logic is resident within each test cell 12.

Figure 8:
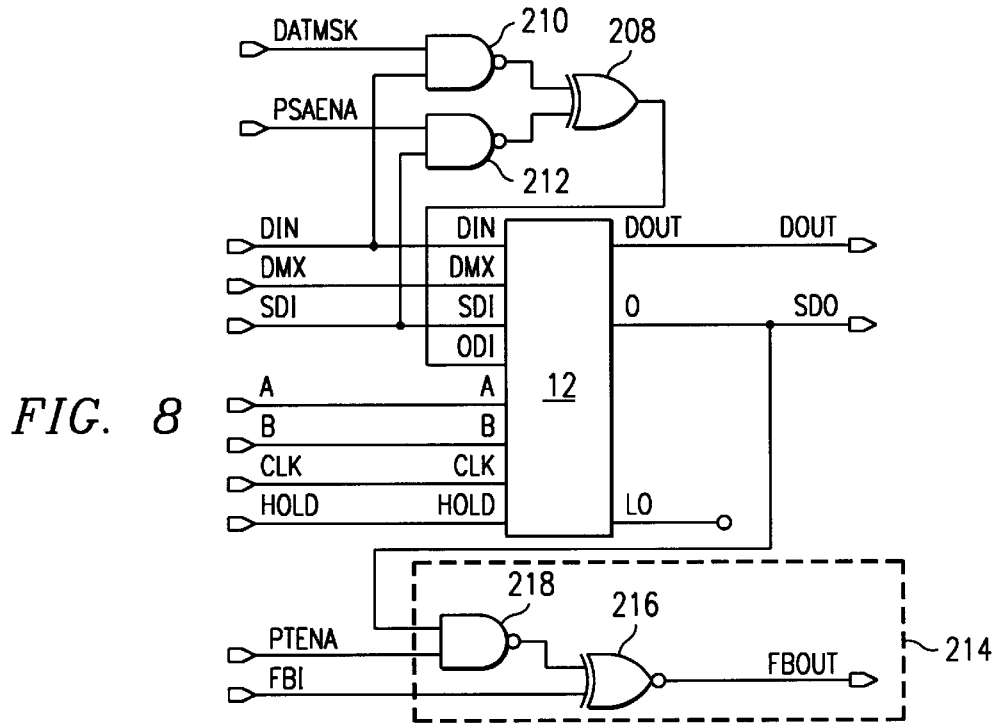
FIG. 8 illustrates a test circuit comprising a base test cell with PRPG/PSA logic circuitry and programmable polynomial tap logic circuitry.

The preferred implementation of a test circuit comprising a base test cell 12, PSA logic section 206 and a Programmable Polynomial Tap 214 is shown in FIG. 8. The inputs and outputs to the test cell 12 and the PSA logic section are the same as shown in FIG. 7. The Programmable Polynomial Tap logic section 214 requires two additional input signals, Polynomial Tap Enable (PTENA) and Feedback Input (FBI), and one additional output signal, Feedback Output (FBO). The PTENA signal is an extension of the control bus. The FBI and FBO signals provide the interconnect between test circuits for implementing the polynomial feedback network, required for the PRPG and/or PSA test operations. The Programmable Polynomial Tap logic section comprises an Exclusive NOR gate 216 and a NAND gate 218. The NAND gate receives the SDO output of the associated test cell 12 and the PTENA signal as input. The Exclusive NOR gate 216 receives the output of the NAND gate 218 and the FBI signal. The output the Exclusive NOR gate 216 is the FBO signal.

A key capability required to perform PRPG or PSA is to provide a feedback network which is based on the Exclusive OR of the logic state in all or a selected group of test circuits in scan path. The result of this feedback network is input to the first test circuit in the scan path to close the feedback loop. In FIG. 8, the combination of the NAND 218 and Exclusive NOR gate 216 provide the capability to include or exclude the logic state of the particular test circuit in the feedback network.

Test circuits having similar Programmable Polynomial Tap logic sections may be interconnected together as shown in FIG. 9a. Four test circuits 220a–d having PRPG/PSA logic sections and Programmable Polynomial Tap logic sections are interconnected in the scan path from the primary serial data input (PSDI) to the Primary Serial Data Output (PSDO) signal. The Programmable Polynomial Tap logic of each test cell 220a–d is interconnected in such a way that a trailing test circuit's FBO output signal supplies the input for a leading test circuit's FBI input. For example, the FBO of test circuit 220c is connected to the FBI of test cell 220b. The PTENA input for each test circuit 220a–d is applied via the PTENA bus. A feedback select (FBSEL) input (an extension of the control bus 17) controls a multiplexer 222 at the input of the first test circuit 220a which feeds the SDI input of the test circuit 220a. The FBI input of the last test circuit 220d is wired to a low logic level so that it have no effect on the Programmable polynomial Tap logic of the last test circuit 220d.

During normal shift operations, serial data enters PSDI and flows through the test cells and out PSDO. When placed in the PRPG or PSA mode, the multiplexer 222 at the input of first test circuit 220a selects the feedback result (FBR) signal to be connected to the SDI input of the first test circuit 220a. The Programmable Polynomial Tap logic in the test circuits 220a–d, in combination with the FBI and FBO wiring interconnects, forms the Exclusive OR feedback network required for PRPG and PSA operations. If the PTENA input of a test circuit is high, the logic state of test cell 12 of that test circuit 220 is included in the feedback network. If the PTENA input to a test circuit is low, the logic state of the test cell 12 of that test circuit is not included in the feedback network.

In some application it may be necessary to partition a primary scan path, consisting of a series of test cells 12, each having PRPG/PSA and Programmable Polynomial logic, into sections. Each section of the primary scan path may be configured as shown in FIG. 9b to provide multiple localized PRPG/PSA test functions within the primary scan path. Each section of the scan path has a feedback connection as shown in FIG. 9a to allow selecting the appropriate test cells 12 in the scan path section to be included in the local feedback network. The Feedback Result (FBR) of each local feedback network is coupled up to the first test cell 12 in a scan path section, via a multiplexer.

The PSA test logic may also be included in the bidirectional test cell of FIG. 4. The inclusion of the PSA test logic provides the same benefits to bidirectional test cells as described in the unidirectional case.

Figure 10:
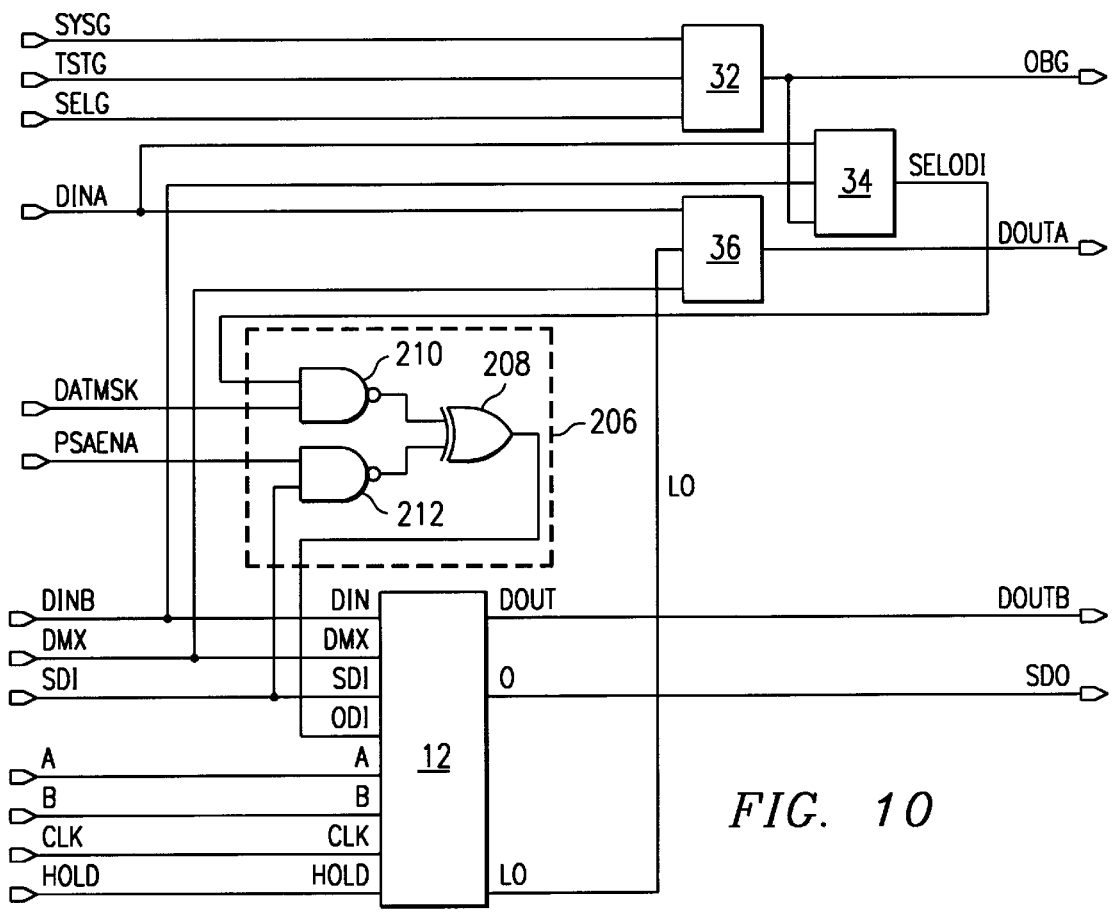
FIG. 10 illustrates a bidirection test cell having PRPG/PSA test circuitry.

A preferred implementation of a test circuit comprising a base test cell 12, bidirectional multiplexer logic and a PSA logic section 206 is shown in FIG. 10. The input and output signals required for this test circuit are the same as those used in connection with FIGS. 4 and 7. The only change required to create the bidirectional test circuit with PSA logic is to insert the PSA logic and make the following wiring connections: (1) connect the SELODI output of the second multiplexer 34 up to the input of PRPG/PSA NAND gate 210 shown connected to DIN in FIG. 7, (2) connect the SDI input attached to the test cell up to the input of PRPG/PSA NAND gate 212 as shown in FIG. 7, and (3) connect the output of PRPG/PSA exclusive OR gate 208 up to the ODI input of the test cell 12.

Figure 11:
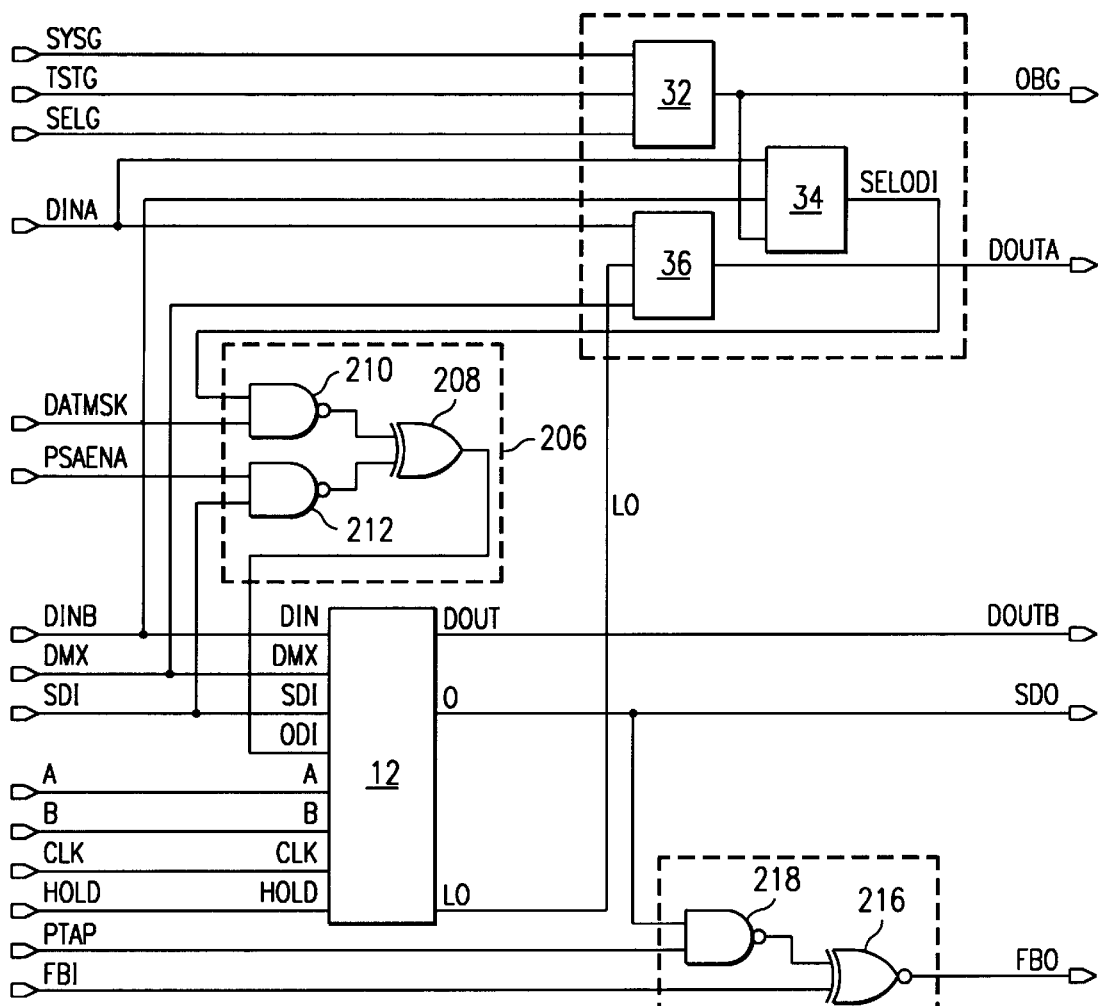
FIG. 11 illustrates a bidirectional test cell having PRPG/PSA test circuitry and programmable polynomial tap circuitry.

FIG. 11 illustrates a bidirectional test circuit having both a PRPG/PSA logic section 206 and a Polynomial Tap logic section 214. The circuit of FIG. 11 is identical to the circuit of FIG. 10 with the additional Polynomial Tap logic section 214 connected to test cell 12 as illustrated in connection with FIG. 8. Similarly, other combinations of library cells are available for the bidirectional test circuit, such as a bidirection test circuit including maskable compare logic or a bidirectional test circuit including maskable compare logic, PRPG/PSA logic and polynomial tap logic.

While the cell library of the present invention has been discussed in connection with the base test cell 12 of FIG. 2, the concept could be used with a base test cell 12 having another architecture. The library cells provide a integrated circuit designer with a range of bit slice testability cells that can be used to construct a variety of different integrated circuit test structures. The advantages of providing test solutions in the form of library cells are: (1) simplification of the implementation of test architectures in integrated circuit designs, (2) providing structured test methodologies that can be automated, (3) elimination of the need to construct ad-hoc test approaches for every new integrated circuit design, (4) improvement of placement and signal routing of test architectures, since all required test logic is zresident within the test circuits and, (5) providing the customer with a basis from which desired testability features may be selected.

To facilitate testing at the IC through system level, standard off-the-shelf components, such as registers, latches, buffers or transceivers, may be designed to include a test interface and a boundary scan path comprised of test cells 12. Implementing test circuitry into standard components for the purpose of simplifying test at higher levels of assembly provides a method of reducing the cost to test and maintain hardware systems.

Today, the testing of circuit boards and systems requires the use of expensive test equipment and mechanical probing techniques. In order to test a board residing in a system, it must be removed so that test access to test equipment is available.

Standard components with embedded test circuitry that is accessible via a serial test interface, simplifies testing. A board design which uses such parts can be tested while it remains in the system, via the serial test bus. Also such devices allow testing to be performed with simpler, less expensive test equipment. In addition, with state of the art board designs, it may not be physically possible to probe a circuit because of the component density. In this case testing may only be performed via the test circuitry embedded in the components.

Figure 12:
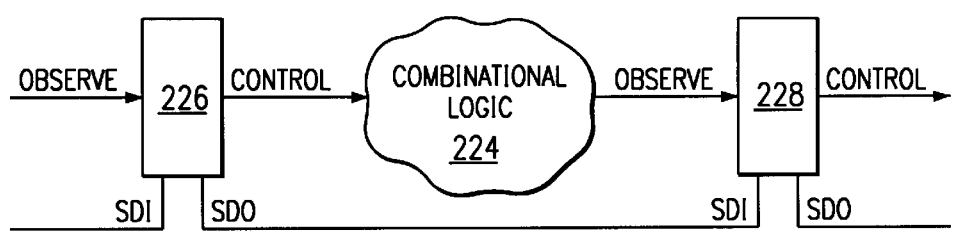
FIG. 12 illustrates a circuit using test devices to observe inputs and control outputs to and from standard combinational logic.

FIG. 12 illustrates a situation where combinational logic 224 is being observed and controlled by test partitioning devices 226 and 228. The test partitioning devices 226 and 228 could be based on a number of well-known devices such as buffers, latches, registers or transceivers. For purposes of illustration, it is assumed that the partitioning devices 226 and 228 are 8-bit registers. The combinational logic may comprise any number of circuits without in-circuit testing ability.

The input test register 226 may observe the data which would otherwise be sent to the combinational logic, and may output data to control the combinational logic 224. The output test register 228 may observe the data output from the combinational logic 224 and may control the output to devices which would otherwise be connected to the output of the combinational logic 224. Serial data is received by the input test register 226 which outputs serial data to the output test register 228. By observing inputs and controlling outputs, the test register 226 and 228 may test the combinational logic 224 in much the same way as previously described in connection with FIG. 1.

Figure 13:
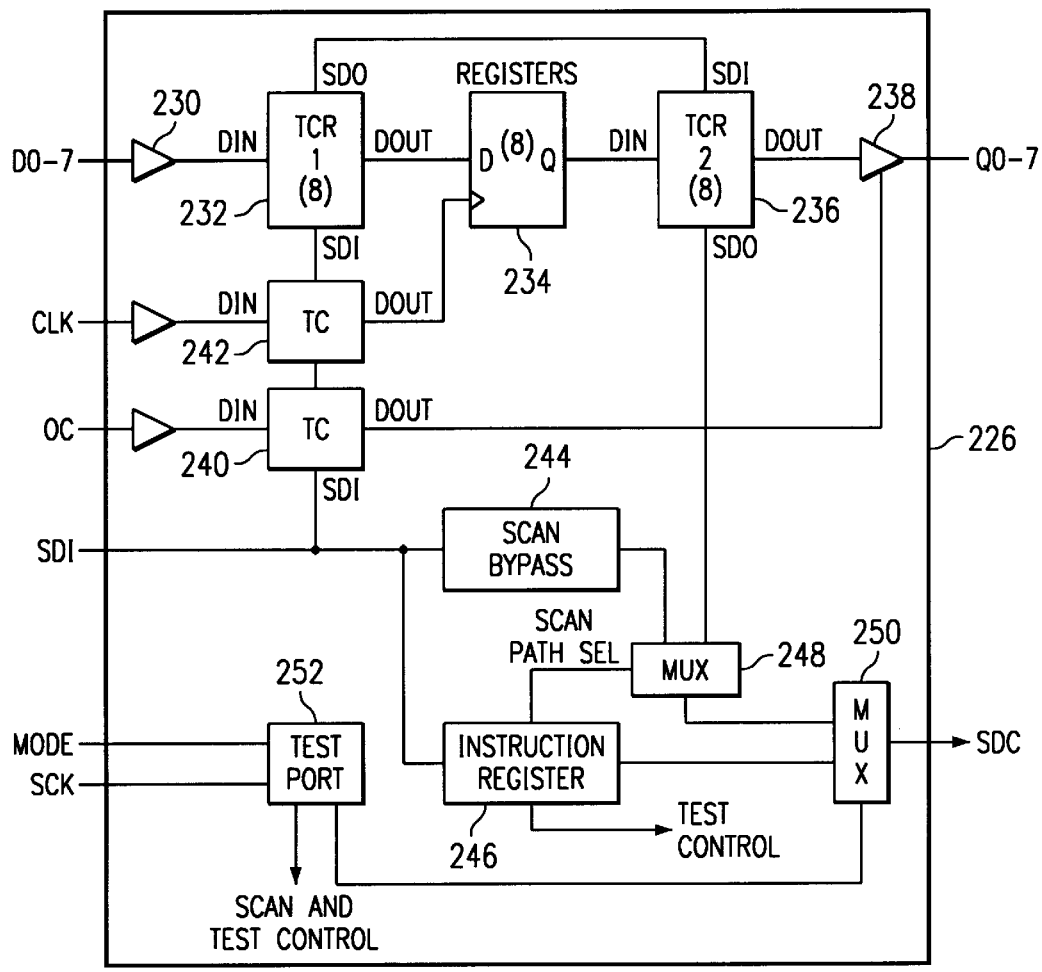
FIG. 13 illustrates a circuit diagram of a preferred embodiment of a test device of FIG. 12.

FIG. 13 illustrates an embodiment of a test device 226. Data inputs DO-7 are input to the test device 226 through input buffer 230. The output of input buffer 230 is connected the an input test circuit register (input TCR) 232. The output of the test circuit register 232 is connected to a register 234. The output of the register 234 is connected to an output test circuit register (output TCR) 236. The output of the output TCR 236 is connected to an output buffer 238, which provides the output data signals QO-7. Test cells 240 and 242 receive control signals from outside the device. In this case, test cell 242 receives a clock input (CLK) and test cell 240 receives a control input (OC). The output of test cell 240 is connected to the output buffer 238 for tri-state operation. The output of test cell 242 is connected to the clock input of register 234. The SDI signal from outside the test device 236 is received by the test cell 240, a scan bypass register 244 and an instruction register 246. A scan data path exists through the test cell 240, test cell 242, the input TCR 232 and the output TCR 236. Serial data output of the output TCR 236 is connected to a multiplexer 248 along with the output of the scan bypass 244. The multiplexer 248 receives a scan path select signal from the instruction register 246. The output of the multiplexer 248 is connected to a multiplexer 250 along with an output from the instruction register 246. The multiplexer 250 also receives a select signal from a test port 252. The test port receives MODE and clock (CLK) signals from outside the test device 226 and outputs scan and test control signals. The instruction register 246 also outputs test control signals to the test cells 240 and 242 and TCRs 232 and 236.

It should be noted that the control signals (CLK and OC) input to the test register are exemplary, and other signals may be used for a specific application. For example, a clear signal or an enable signal could be connected through a test cell to a suitably designed register. Also, the register could be replaced by appropriate circuitry to implement a latch, buffer, transceiver or other device. Also, the number of control and data I/O signals may change depending on the implementation of the device.

The scan structure of the test device 226 comprises a boundary scan path (through the test cells 240 and 242 and TCRs 232 and 236), a scan bypass path and an instruction scan path. A scan access protocol issued via the MODE and SCK inputs allows serial data to be scanned into either the boundary or bypass scan path, or the instruction register. The selection between the boundary or bypass scan path is determined by the current instruction residing in the instruction register, via the scan path select output to multiplexer 248.

The TCRs 232 and 236 comprise a plurality of test circuits based on the test cell 12, as discussed previously. Typically, the TCRs 232 and 236 will be formed from a plurality of test circuits with PRPG/PSA and/or programmable polynomial tap logic sections. The test cells 240 and 242 are typically base test cells 12 without additional circuitry. The control circuitry to the test cells 240 and 242 and TCRs 232 and 236 is not shown; however, a control bus would be connected to each cell for serial data shifting and test circuit control.

Test instructions may be scanned into the instruction register 246 to cause the boundary scan logic to perform a test operation. If a test is not being performed, a normal operation instruction is scanned into the instruction register 246. During a normal operation instruction, the boundary scan logic allows normal I/O and control signals to flow freely through the boundary scan logic.

A "boundary scan instruction" may be installed in the instruction register to allow the boundary scan path (through the TCRs 232 and 236 and the test cells 240 and 242) to take control of the internal I/O signals. This control is accomplished by setting the DMX input of the boundary scan cells to a high logic level. In this mode, external control can be issued by the MODE and SCK input to cause the boundary scan path to capture the logic level on the DIN inputs of the test cells 240 and 242 and TCRs 232 and 236. During the capture operation, the test cells 240 and 242 and input TCR 232 capture the state of the external data outputs (D0–7) and control inputs. Also during the capture operation, the output TCR 236 captures the state of the internal logic 234. After the data has been captured, additional external control is input via MODE and SCK inputs to cause the boundary scan path to shift out the captured data for inspection via the SDO pin.

While the captured data is shifted out, a test control pattern is shifted into the boundary scan path via the SDI input. During the capture and shift operation, the DOUTs will remain in their present state because the HOLD input thereto will be set low. If not held constant, the ripple effect at the output could upset external logic attached to the outputs of the device.

When the shifting in and out of the boundary scan path is complete, additional external control is input via the MODE and SCK inputs to cause the previously installed control pattern to be applied from the latches 26 of the various test cells and TCRs 240, 242, 232 and 236. The process of capturing the boundary scan path inputs, followed by shifting out the captured data for inspection while shifting in the next test control pattern to be applied from the boundary scan path outputs is repeated until the desired level of testing is complete. In this way, the interior logic and external wiring interconnects and/or a neighboring ICs may be simultaneously tested.

A "boundary data sample instruction" may be installed in the instruction register 242. The boundary data sample instruction allows data and control to pass freely through the boundary scan path while the SCK and MODE inputs cause the boundary scan path to capture the logic state existing at their inputs. Once the boundary data has been captured, additional external control is issued via the SCK and MODE inputs to cause the boundary scan path to shift out the captured data for inspection via the SDO pin.

A "control outputs to high impedance state instruction" allows the output buffers (Q0–7) to be placed in a high impedance state. Although the outputs are in a high impedance state, the inputs remain functional and data and control inputs still affect the internal logic 234. During this instruction, the scan bypass register (a single flip-flop) is coupled to the SDI and SDO pins, to form a single bit scan path through the test device during data register scan operations.

The benefit of this instruction is to place the outputs in a tristate condition, which allows an external test probe to be applied to control the outputs to a logic 1 or 0. Also, the abbreviated data scan path through the scan bypass flip-flop allows reducing the internal scan path length to a single bit.

A "control boundary outputs to a logic 1 or 0 instruction" allows the boundary scan path to take control of the I/O signals in order to apply a prescanned test control pattern from the outputs of the test cells 240 and 242 and TCRs 232 and 236. Prior to performing this test instruction, the boundary scan path will have been scanned to install the test control output pattern to be applied by the instruction. During this instruction, the scan bypass register is coupled to the SDI and SDO pins in order to form a single bit scan path through the test device during data register scan operations.

The benefit of this instruction is to allow the test device to output a particular pattern while testing is being performed on other devices connected to the test device output, such as the combinational logic 224. Also, the abbreviated data scan path through the scan bypass flip-flop during instruction allows the internal scan path length to be reduce to a single bit.

The input and output TCRs 232 and 236 may be instructed to operate synchronously with the external applied SCK input to provide additional testing capabilities. The benefit of these test operations is that no scanning is required during the test operation, thus reducing the test time significantly.

Figure 14:
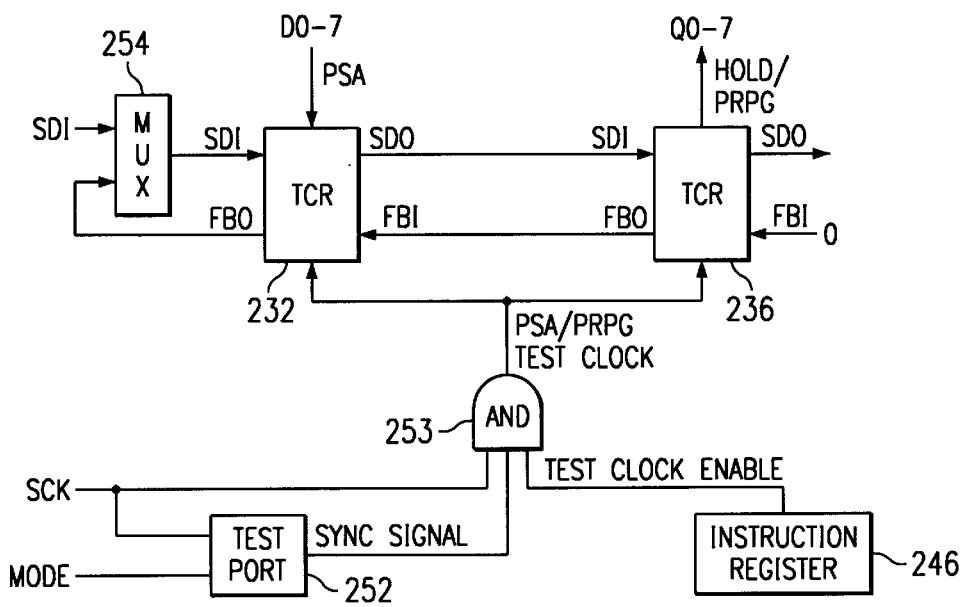
FIG. 14 illustrates a circuit diagram of a test device performing PSA operations.

The PSA operation is discussed in detail in connection with FIG. 7. The input TCR 232 may perform the PSA operation either by itself or in conjunction with the output TCR 236. A circuit showing the input and output TCRs 232 and 236 used in conjunction to provide a 16-bit wide signature (assuming 8-bit TCRs) is illustrated in FIG. 14. Data appearing at the data input is summed with the present state of the input TCR 232 and is clocked into the input TCR 232 by the PSA/PRPG test clock signal output from the AND gate 253. During a PSA operation, the input TCR 232 is placed in the load mode and the output TCR 236 is placed in a shift mode and acts as an 8-bit shift register extension to the input TCR 232. By combining the input TCR 232 with the output TCR 236, a 16-bit wide signature of the 8-bit data input bus is available. Using a 16-bit PSA circuit, the number of input data patterns that can be compressed into the input TCR 232 is increased from 255 to 65,535. During PSA operations, the data output (Q0–7) from the output TCR 236 is fixed to a predetermined pattern, so that the rippling data during PSA is not propagated out to the combinational logic 224.

The clocking for PSA comes from a gating circuit shown in FIG. 14. When the PSA instruction is installed and the external control has placed the test port 252 in an idle state, the gating signals are adjusted to allow the AND gate 253 to pass the SCK input to the TCRs 232 and 236. The instruction register 246 outputs a test clock enable signal when the instruction is installed. The test port 252 outputs a sync signal when it enters a non-scanning idle state. When both enable signals are set high, the external SCK is gated through the AND gate 252 to produce the PSA/PRPG test clock.

At the end of a PSA instruction, the external control (SCK and MODE) will cause the test port 252 to inhibit the PSA/PRPG test clock and a new instruction will be scanned into the instruction register 246. After the scan path is set back to its normal configuration, the signature stored in the TCRs 232 and 236 can be scanned out for inspection via a boundary scan read instruction, explained hereinbelow.

Similarly, a PRPG instruction may be installed in the instruction register 246 to provide output pattern generation. Once again, the TCRs 232 and 236 may be combined to provide a 16-bit wide pattern generation capable extending the number of 8-bit output patterns. The 16-bit configuration is similar to that shown in FIG. 14. During a PRPG operation, both TCRs are placed in a shift mode. The pattern generation is output from the output TCR 236. Clocking for PRPG is identical to that described in the PSA instruction.

Similarly, a new instruction will be scanned into the instruction register at the end of a PRPG operation to reset the test clock enable bit and re-configure the boundary scan path to its normal routing path.

Figure 15:
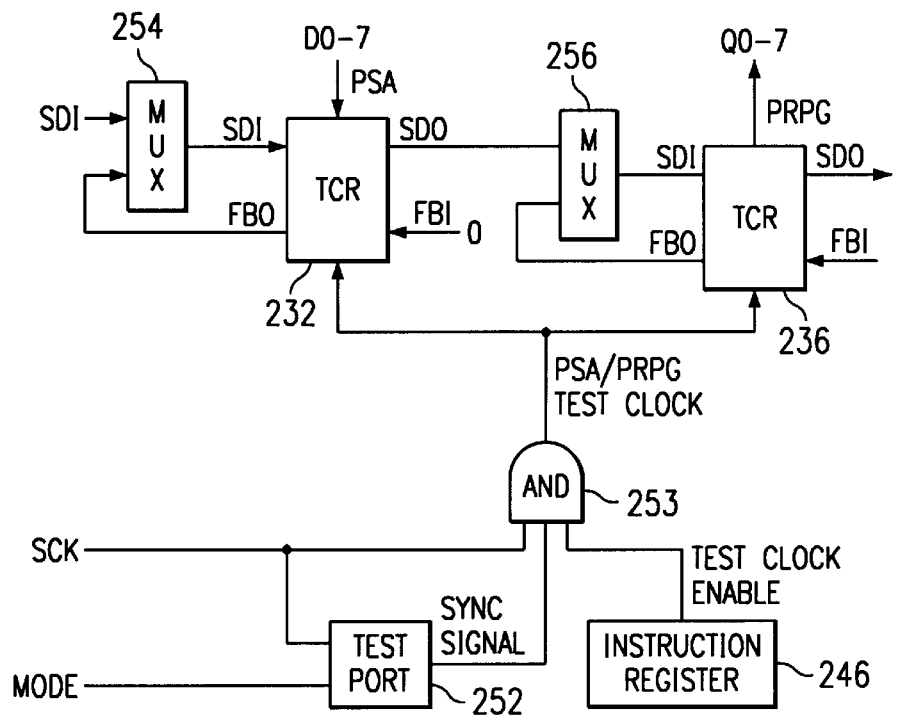
FIG. 15 illustrates a circuit diagram of a test device performing simultaneous PSA and PRPG operations.

As shown in connection with FIG. 15, PSA and PRPG may be run simultaneously. In this configuration, the input and output TCRs 232 and 236 are not combined, but rather fed back into themselves. Local multiplexers 254 and 256 provide the required feedback connections to the TCRs 232 and 236 respectively. Since the TCRs cannot be linked together in this configuration, the PSA and PRPG operations are limited to 8-bits. The clocking for the PSA and PRPG operations is identical to that described in connection with the PSA instruction.

Similar in configuration to the simultaneous PSA and PRPG instruction in FIG. 15, a simultaneous PSA and binary count up pattern output instruction may also be performed. During this instruction, the input TCR 232 performs PSA and the output TCR 236 outputs a binary count up pattern. The clocking for the PSA and binary count up pattern operations is identical to that described in connection with the PSA instruction. The binary count up pattern is useful in providing binary address patterns during memory testing. During this instruction a memory device's address may be stimulated by the count up pattern from a TCR 236 of one test register while its data output is compressed by a TCR 232 of another test register. A similar test application would be performed by a PSA and PRPG instruction.

Figure 16:
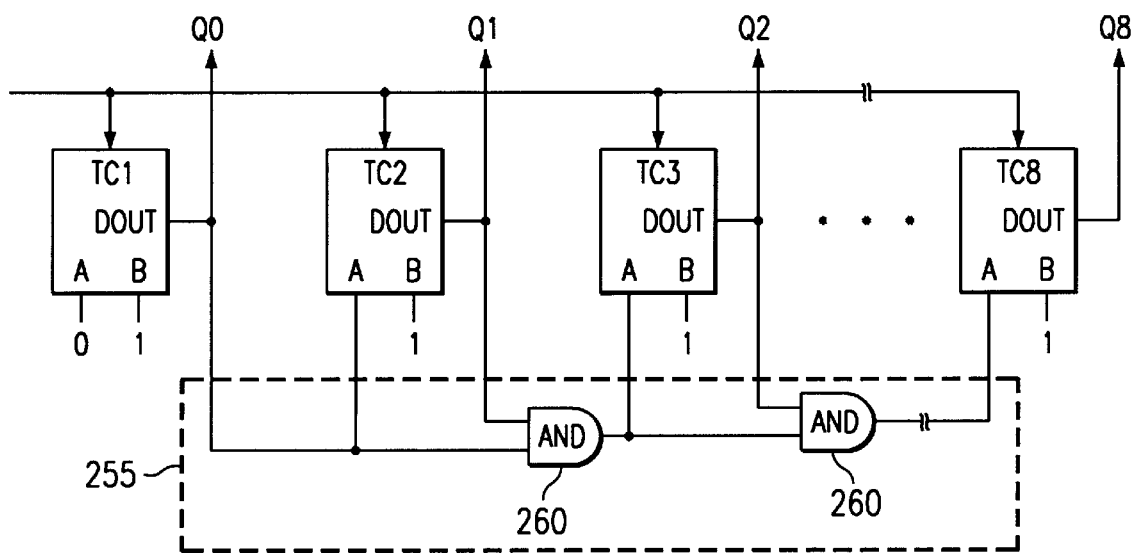
FIG. 16 illustrates a circuit diagram of the present invention.

In FIG. 16 the test cells 12 of TCR 236 are shown attached to a Count Enable Logic section 258 to allow a binary count up pattern to be output from TCR 236. The count enable logic 258 comprises a plurality of AND gates 260. Each AND gate 260 receives the output of the previous AND gate as one input and the DOUT signal from an associated test cell 12 as the other input. The first AND gate 260 receives the DOUT signal from the first two test cells 12. The output of each AND gate 260 is connected to one A select part of the next test cell 12. In this arrangement, the least significant test cell 12 in TCR 236 is set to Toggle Mode (AB=01) and leading test cells 12 are set to operate either in Toggle Mode or Idle Mode (AB=11), depending on the logic level output from the Count Enable Logic to the A inputs of each test cell 12. A test cell 12 will toggle when a PSA/PRPG test clock is applied if all trailing test cells are set to a high logic level. A test cell 12 will remain in its present state (Idle) when a PSA/PRPG test clock is applied if any trailing test cell is set to a low logic level.

Other functions previously described in connection with the test cell 12 may be performed by the testing device. The testing device may be made to perform a toggle operation wherein data installed in the output TCR 236 during a prior scan operation can be made to toggle between the true output pattern and its compliment output pattern during each PSA/PRPG test clock cycle. The toggle capability is useful during the testing of the device's output buffers and at the board level as a simple test pattern generator. The clocking for the toggle operation is identical to that described in the PSA instruction.

The boundary scan path can also be read to determine the contents thereof. The testing device remains in a normal operating mode during this operation. This instruction differs from the boundary scan and boundary data sample instructions in that the capture operation is not performed. The boundary read instruction may be used to extract the results of a PSA operation.

Although the present invention has been described in detail, it should be understood that various changes, substitutions and alterations can be made herein without departing from the spirit and scope of the invention as defined by the appended claims.

What is claimed is:

1. A boundary scan test cell comprising:

A. a first memory;

B. a first multiplexer for connecting one of a plurality of inputs to said first memory responsive to a first control signal;

C. a second memory connected to the output of said first memory; and

D. a second multiplexer for selecting an output from one of a set of inputs to the second multiplexer including the output of said second memory responsive to a second control signal;

E. wherein said second memory includes inverted and non-inverted outputs, said inverted output is connected as one of said inputs to said first multiplexer, such that a toggled output can be produced by the test cell.

2. A boundary scan test cell comprising:

A. a first memory;

B. a first multiplexer for connecting one of a plurality of inputs to said first memory responsive to a first control signal;

C. a second memory connected to the output of said first memory; and

D. a second multiplexer for selecting an output from one of a set of inputs to the second multiplexer including the output of said second memory responsive to a second control signal;

E. wherein the output of said first memory is connected as one of said inputs to said first multiplexer.

3. An integrated circuit having boundary scan testing, comprising:

A. application logic circuitry having one or more inputs and one or more outputs;

B. one or more data inputs for receiving data into the integrated circuit;

C. one or more data outputs for outputting data from the integrated circuit;

D. a test data input for receiving test data into the integrated circuit;

E. one or more input test cells connected between respective data inputs and the input or inputs of said application logic circuitry, said input test cells comprising:

i. first memory for storing serial data from said test data input; and ii. a second memory connected to said first memory for storing output data; from said first memory and F. one or more output test cells connected between the respective outputs of said application logic and the respective data outputs, each of said output test cells comprising:

i. a third memory for storing information from said respective outputs of said application logic circuitry;
ii. a fourth memory for storing information output from said third memory;
iii. a third multiplexer selectively connecting one of a plurality of inputs thereto to said third memory, one of said plurality of inputs being connected to said test data input; and
iv. a fourth multiplexer for selectively connecting one of a plurality of inputs thereto to said data output, the respective output wherein from said application logic and the output of said fourth memory being input to said fourth multiplexer.

* * * * *